United States Patent
Yang et al.

(10) Patent No.: US 11,456,042 B1
(45) Date of Patent: Sep. 27, 2022

(54) MULTI-LEVEL PROGRAM PULSE FOR PROGRAMMING SINGLE LEVEL MEMORY CELLS TO REDUCE DAMAGE

(71) Applicant: SanDisk Technologies LLC, Addison, TX (US)

(72) Inventors: Xiang Yang, Santa Clara, CA (US); Jiahui Yuan, Fremont, CA (US); Abhijith Prakash, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 66 days.

(21) Appl. No.: 17/229,705

(22) Filed: Apr. 13, 2021

(51) Int. Cl.
| G11C 11/34 | (2006.01) |
| G11C 16/34 | (2006.01) |
| G11C 16/10 | (2006.01) |
| G11C 16/30 | (2006.01) |
| G11C 16/26 | (2006.01) |
| G11C 16/08 | (2006.01) |

(52) U.S. Cl.
CPC .......... G11C 16/3459 (2013.01); G11C 16/08 (2013.01); G11C 16/102 (2013.01); G11C 16/26 (2013.01); G11C 16/30 (2013.01)

(58) Field of Classification Search
CPC ......... G11C 16/10; G11C 16/30; G11C 16/12; G11C 16/0483
USPC ........................... 365/185.18, 185.19, 185.22
See application file for complete search history.

(56) References Cited

U.S. PATENT DOCUMENTS

| 6,097,637 | A | 8/2000 | Bauer et al. |
| 8,116,140 | B2 | 2/2012 | Dong et al. |
| 8,369,149 | B2 | 2/2013 | Dutta et al. |
| 9,245,645 | B2 | 1/2016 | Srinivasan et al. |
| 9,922,704 | B2 | 3/2018 | Raghunathan et al. |
| 9,959,932 | B1 | 5/2018 | Zhang et al. |
| 10,008,270 | B2 | 6/2018 | Lee et al. |
| 10,424,387 | B1 | 9/2019 | Zhang et al. |
| 10,515,692 | B2 | 12/2019 | Tang et al. |
| 2006/0044923 | A1* | 3/2006 | Hahn ................ G11C 16/0483 365/230.06 |
| 2007/0133249 | A1 | 6/2007 | Roohparvar |

(Continued)

OTHER PUBLICATIONS

International Search Report & The Written Opinion of the International Searching Authority dated May 2, 2022, International Application No. PCT/US2022/012212.

(Continued)

*Primary Examiner* — Son T Dinh
(74) *Attorney, Agent, or Firm* — Vierra Magen Marcus LLP

(57) ABSTRACT

Apparatuses and techniques are described for reducing damage to memory cells during single bit per cell programming. An initial program pulse in a single bit per cell program operation has a lower, first program level followed by a higher, second program level. As a result of the lower, first program level, the electric field across the memory cells is reduced. The step up time from the first program level to the second program level can be reduced by concurrently stepping up pass voltages of the adjacent unselected word lines. If an additional program pulse is applied, the step up in the program pulse can be omitted. The magnitude of the first program level can be adjusted based on factors such as temperature, number of program-erase cycles, selected sub-block position and selected word line position.

20 Claims, 21 Drawing Sheets

(56) References Cited

U.S. PATENT DOCUMENTS

| | | |
|---|---|---|
| 2008/0192539 A1 | 8/2008 | Choi et al. |
| 2008/0215800 A1 | 9/2008 | Lee et al. |
| 2009/0316487 A1 | 12/2009 | Lee et al. |
| 2013/0173844 A1 | 7/2013 | Chen et al. |
| 2015/0078098 A1* | 3/2015 | Kwak .................... G11C 16/10 365/185.25 |
| 2015/0146484 A1 | 5/2015 | Lee et al. |

OTHER PUBLICATIONS

U.S. Appl. No. 17/149,560, filed Jan. 14, 2021.

* cited by examiner

Fig. 1A
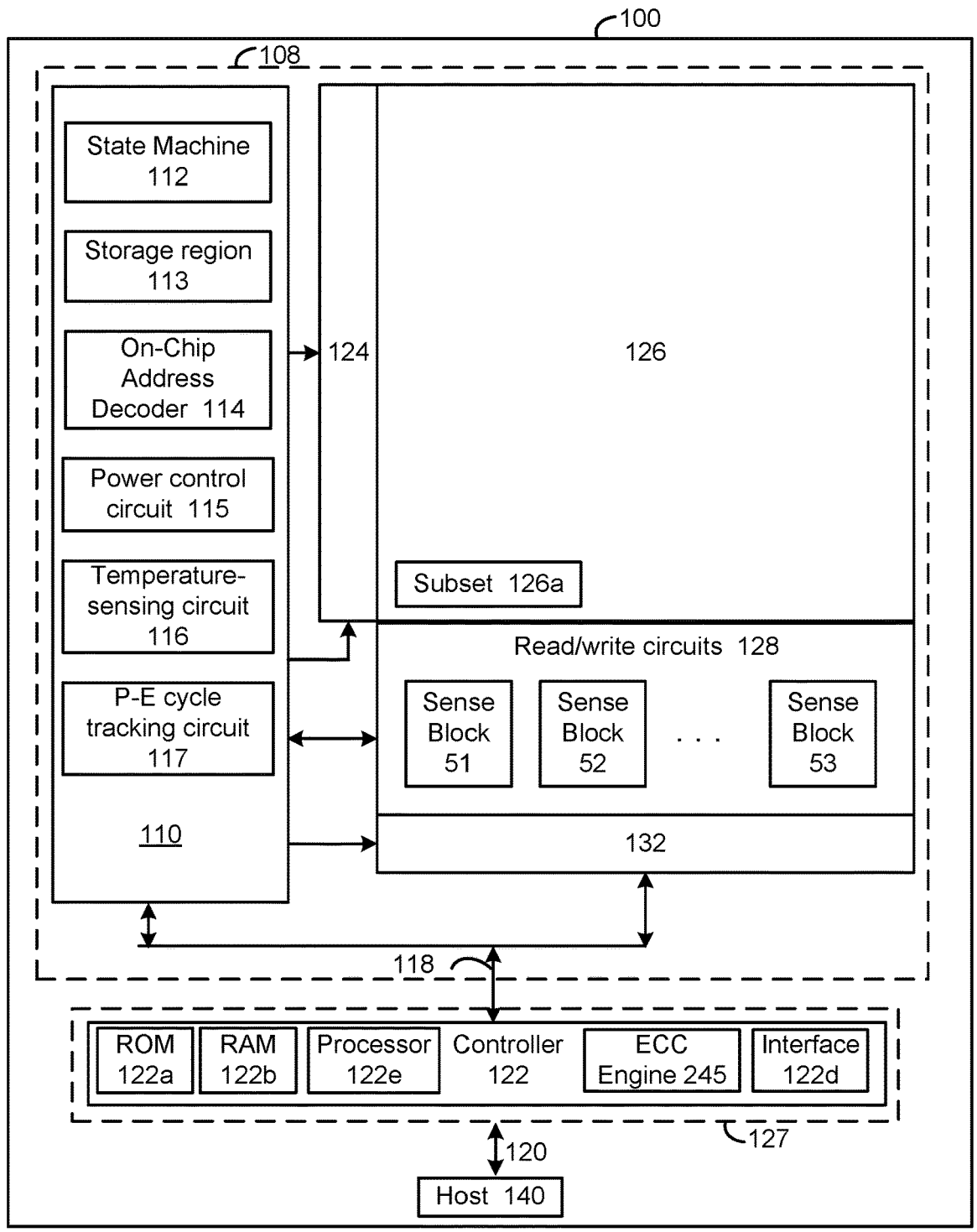
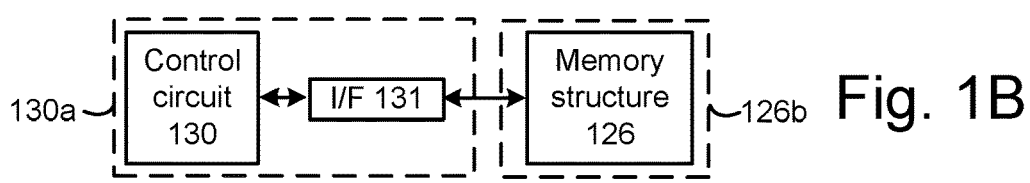
Fig. 1B

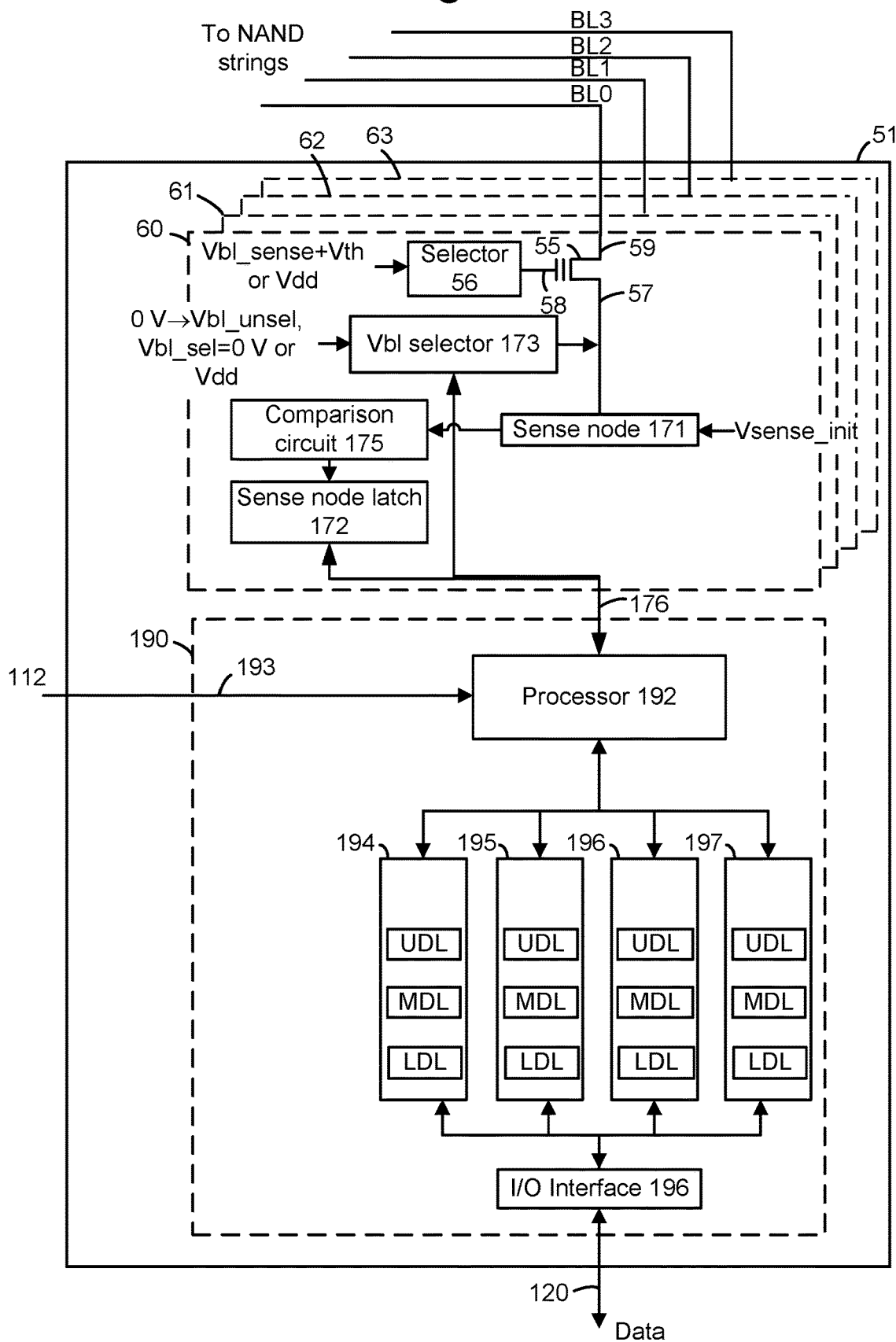

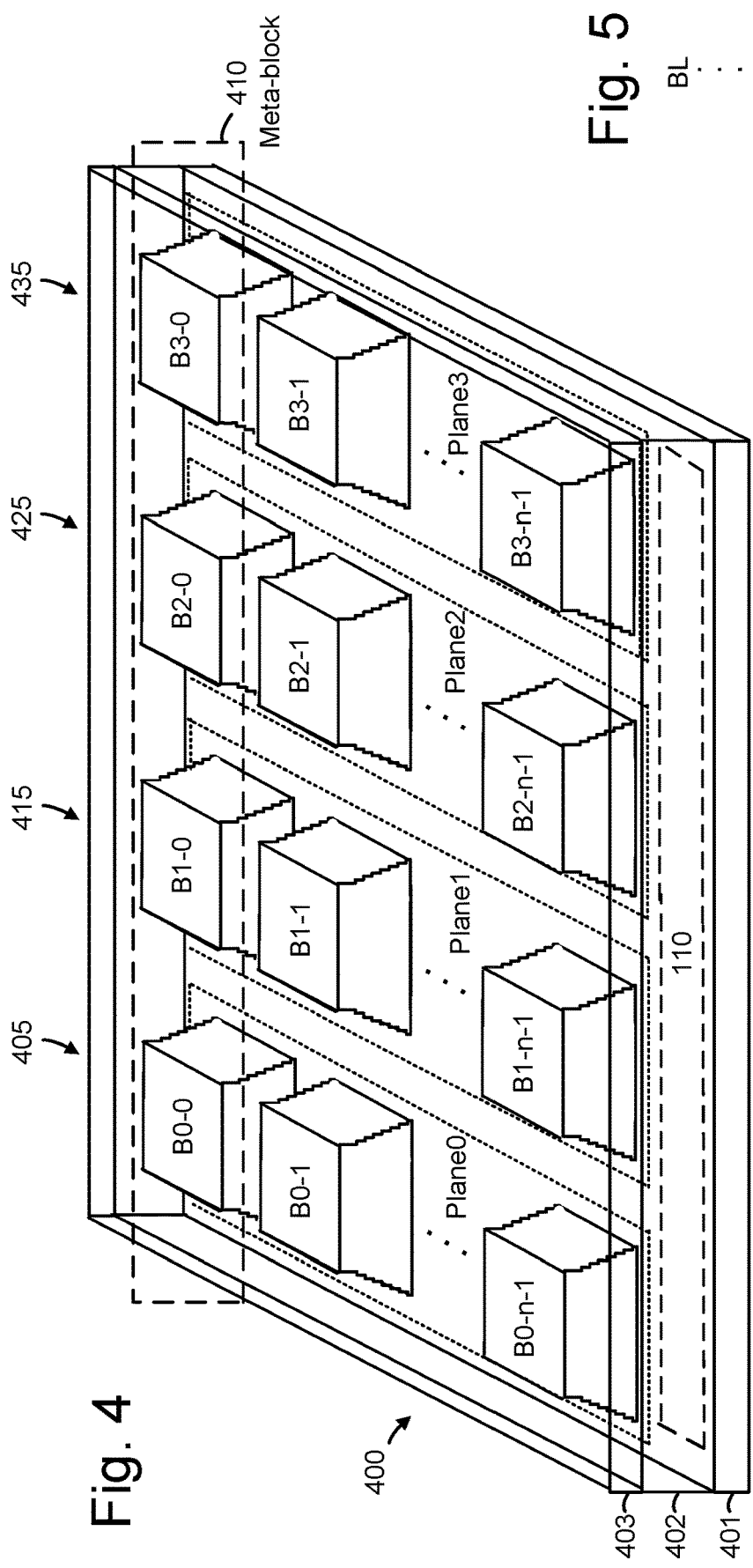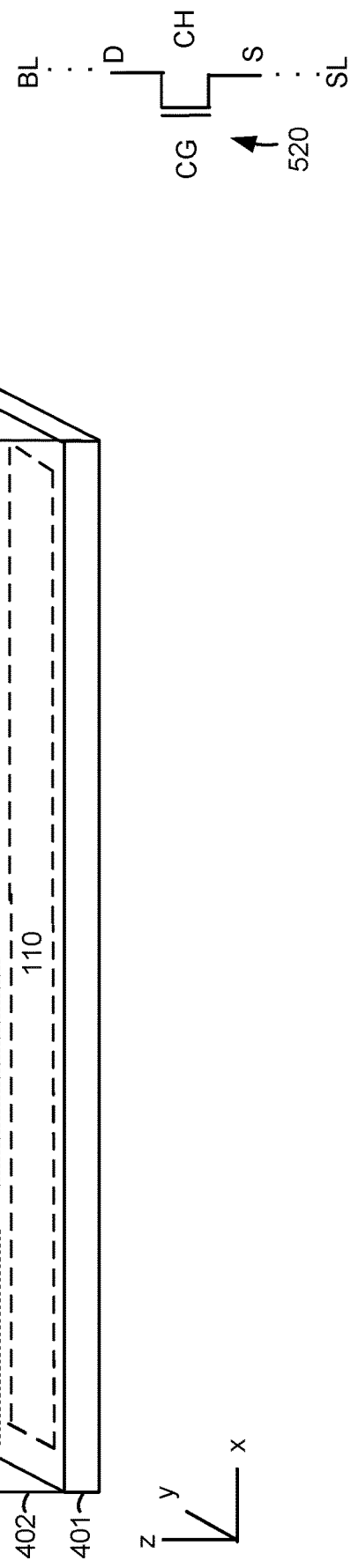

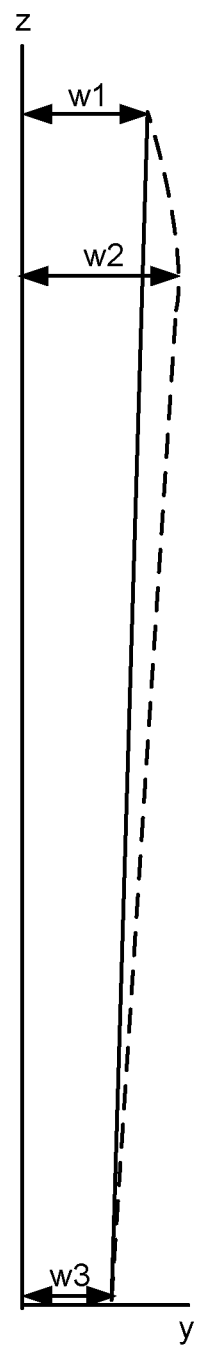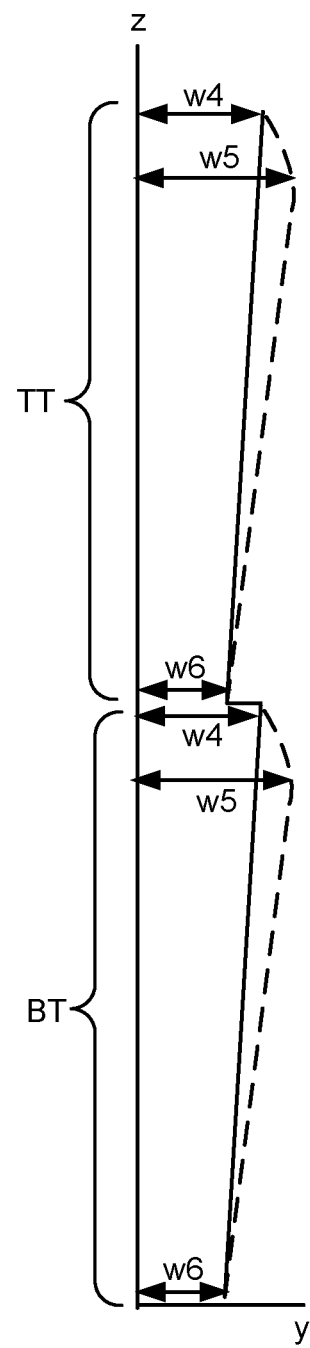

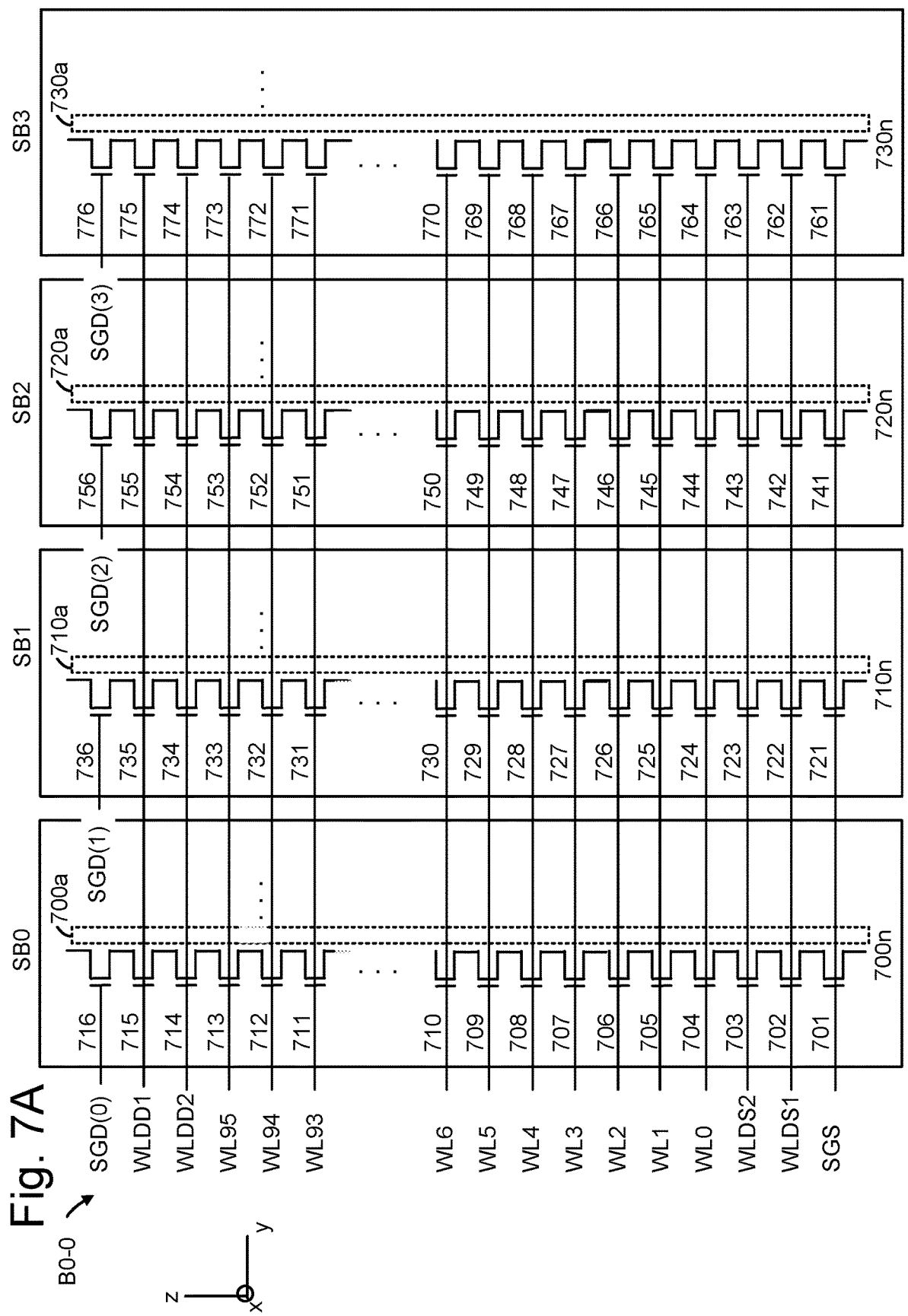

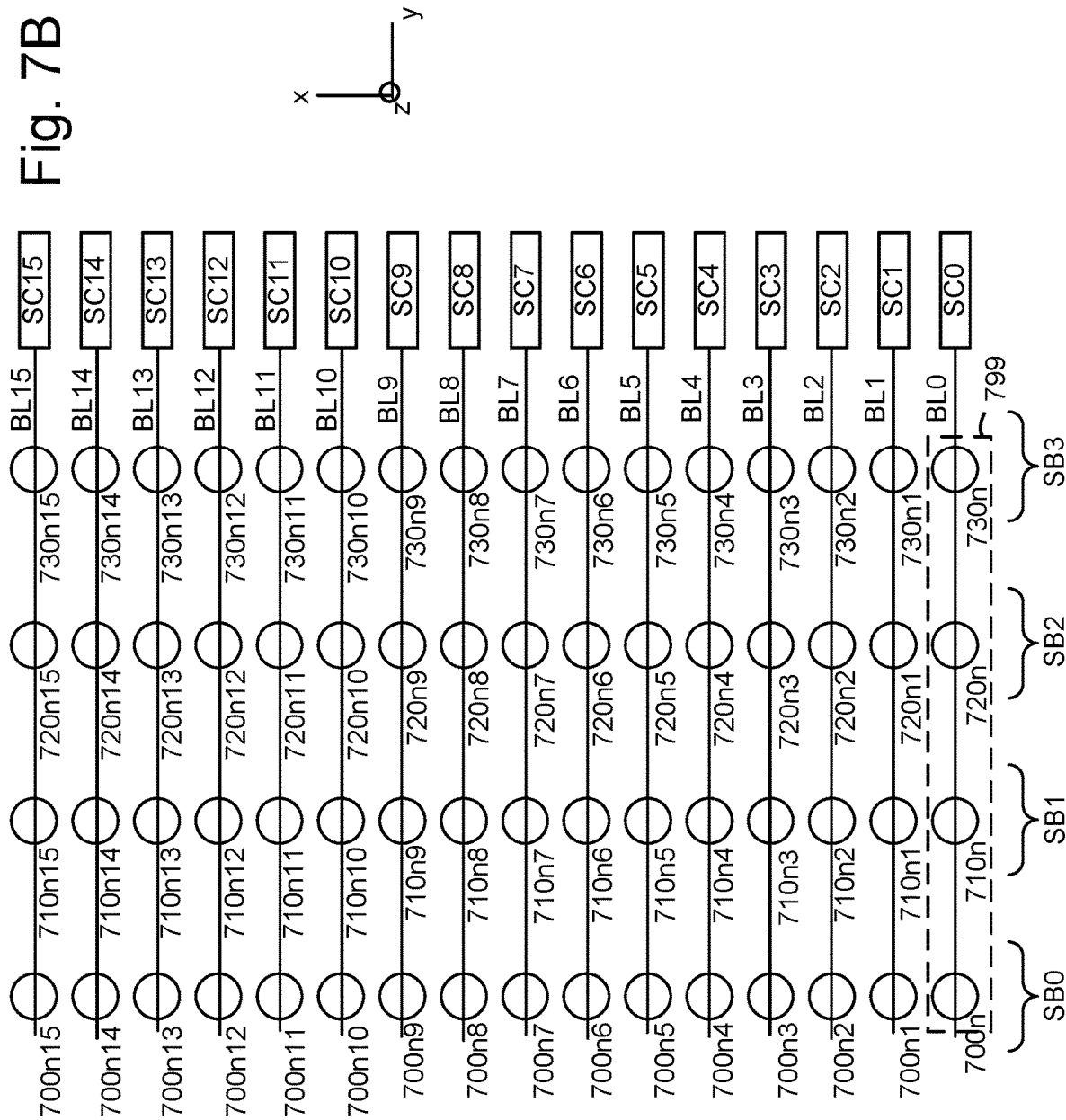

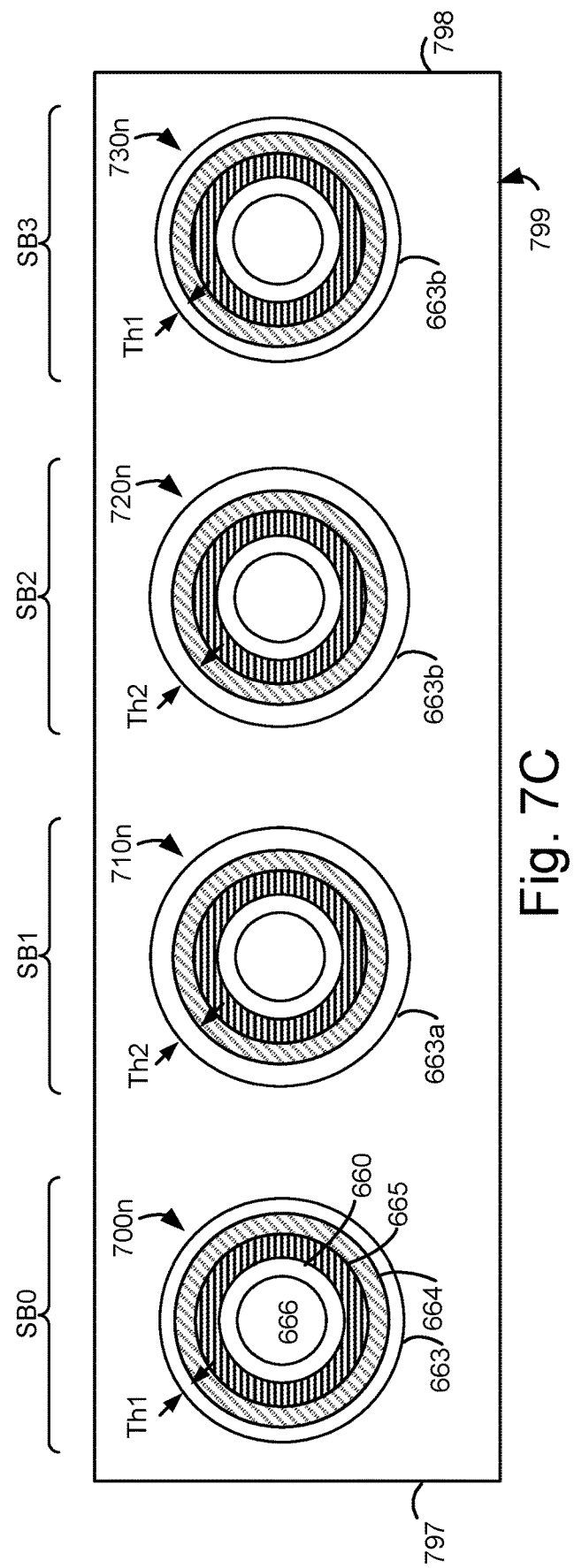

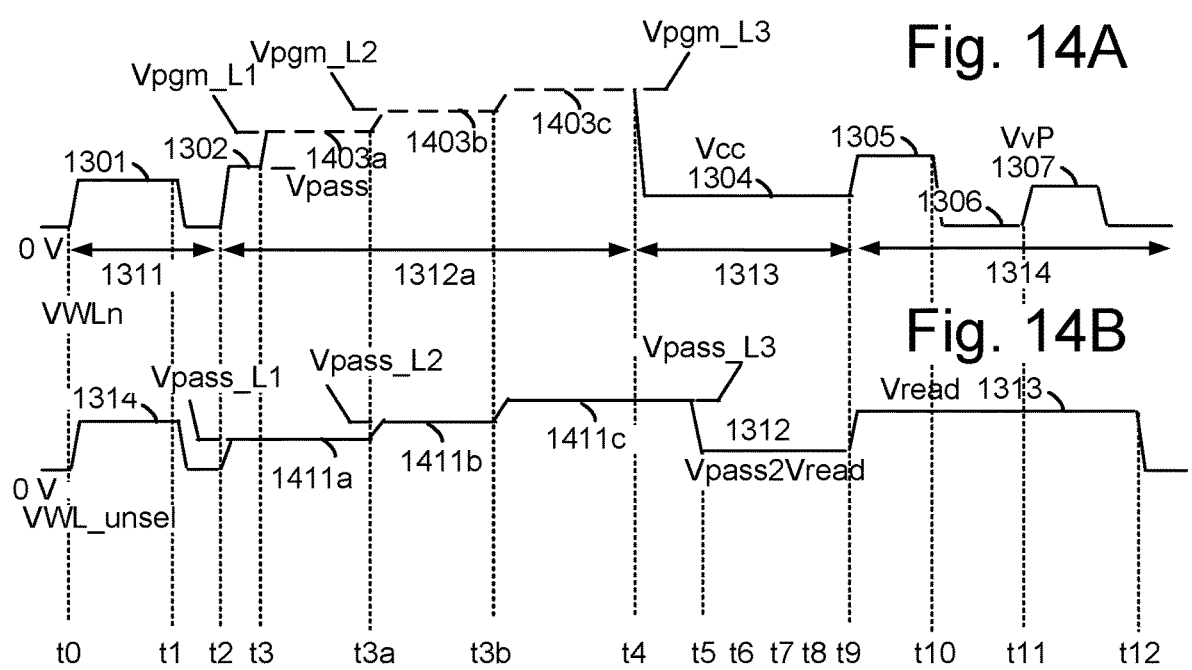

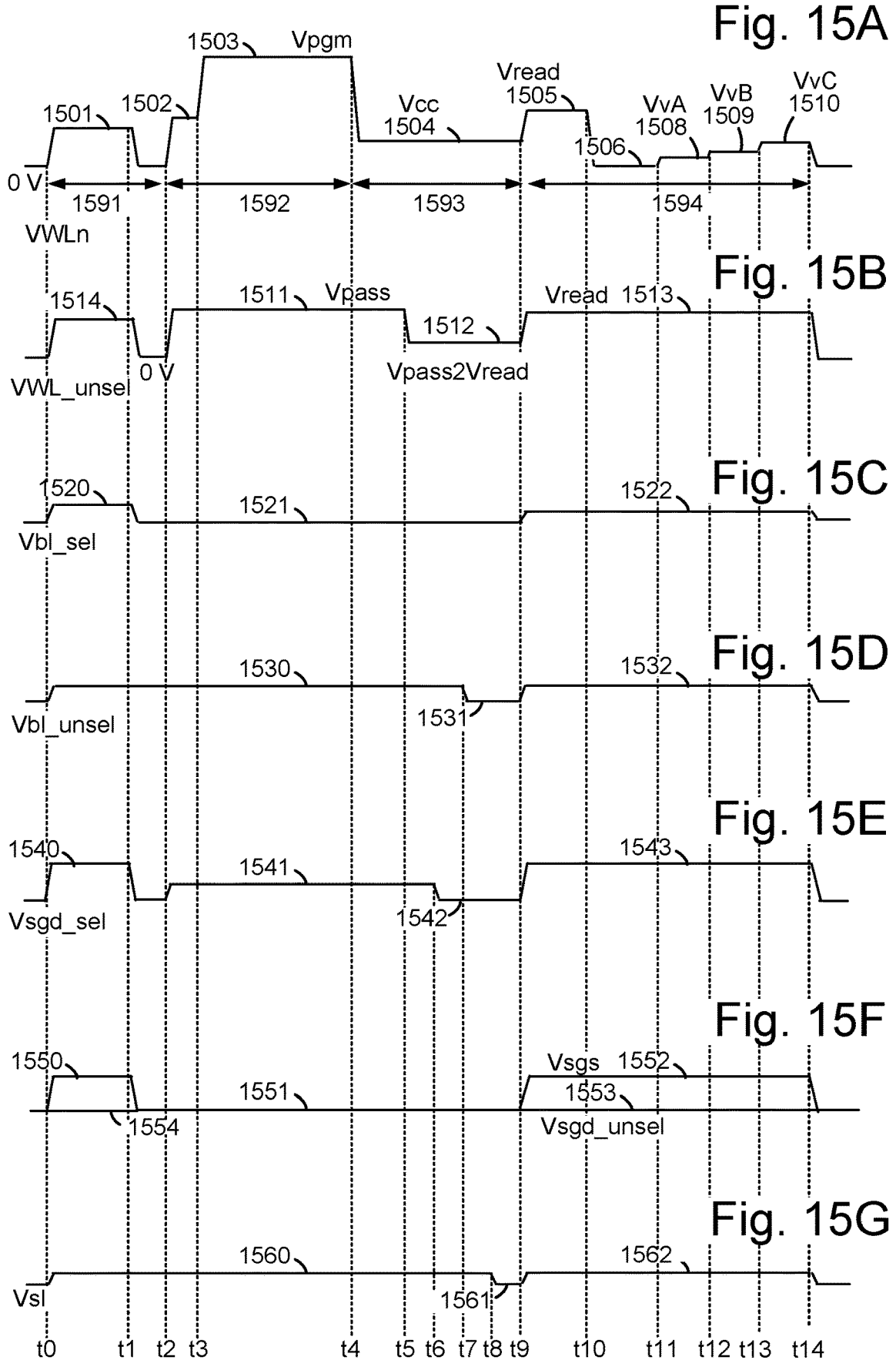

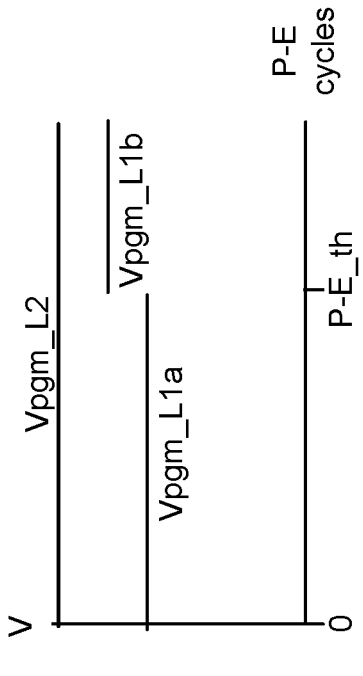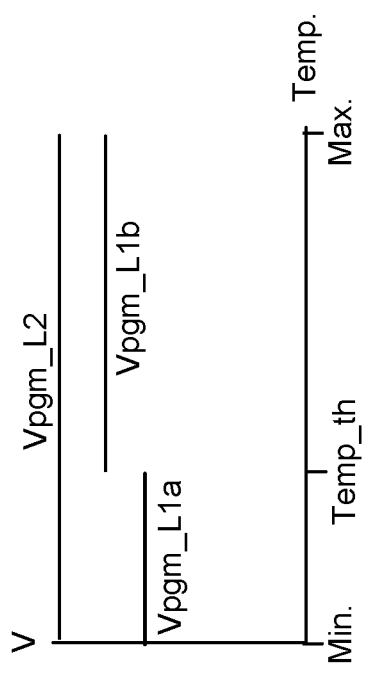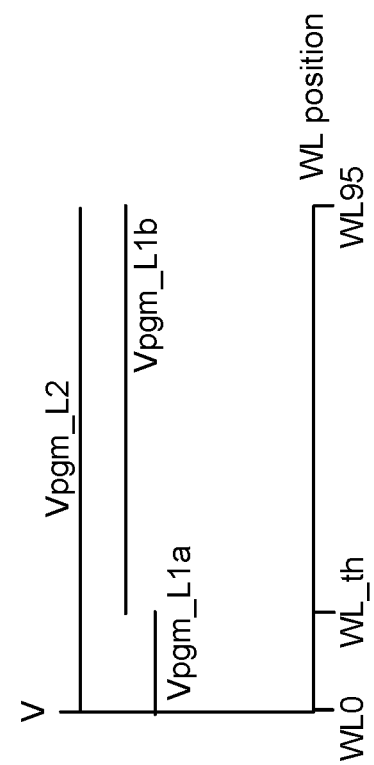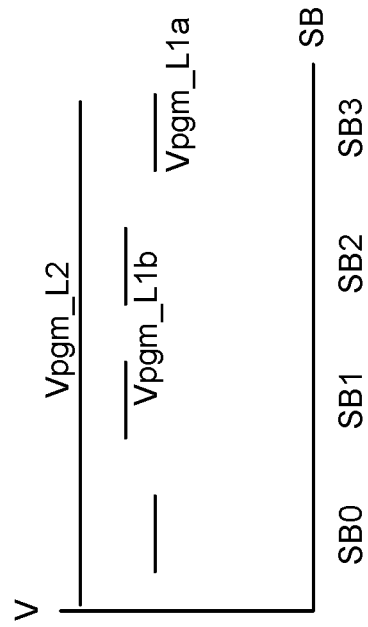

MULTI-LEVEL PROGRAM PULSE FOR PROGRAMMING SINGLE LEVEL MEMORY CELLS TO REDUCE DAMAGE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B is a block diagram of an arrangement of the memory device 100 of FIG. 1A in which a control circuit 130 on a first die 130a communicates with the memory structure 126 on a separate second die 126b.

FIG. 2 is a block diagram depicting one embodiment of the sense block 51 of FIG. 1A.

FIG. 4 is a perspective view of an example memory die 400 consistent with FIG. 1A, where blocks of memory cells are provided in respective planes Plane0-Plane3, and a meta-block 410 comprises blocks B0-0 to B3-0.

FIG. 5 depicts an example transistor 520 in the memory structure 126 of FIG. 1A.

FIG. 6C depicts example plots of memory hole width versus height in the NAND string 700n of FIG. 6A.

FIG. 6D depicts example plots of memory hole width versus height in the NAND string 700na of FIG. 6B.

FIG. 7A depicts an example view of NAND strings in the block B0-0 which is consistent with FIGS. 4 and 6A.

FIG. 7B depicts an example top view of the block B0-0 of FIG. 7A, with respective NAND strings, bit lines and sense circuits.

FIG. 7C depicts the region 799 of FIG. 7B in further detail, showing the varying thickness of a blocking oxide layer in different sub-blocks.

FIG. 12B depicts a flowchart of an example process for programming memory cells in a single bit per cell mode with a damage reduction countermeasure, and in a multiple bits per cell mode without the damage reduction countermeasure.

FIG. 14A depicts voltages applied to a selected word line, WLn in a program loop of a program operation in a single bit per cell mode, consistent with FIG. 12, steps 1212a and 1212b, where the program pulse has three program levels, Vpgm_L1-Vpgm_L3.

FIG. 14B depicts a voltage, VWL_unsel, applied to unselected word lines, consistent with FIG. 14A.

FIG. 15A depicts voltages applied to a selected word line, WLn in a program loop of a program operation in a multiple bits per cell mode, consistent with FIG. 12, step 1212b, where the program pulse has a single program level, Vpgm.

FIG. 15B depicts a voltage, VWL_unsel, applied to unselected word lines, consistent with FIG. 15A.

FIG. 15C depicts a voltage, Vbl_sel, applied to bit lines of programmed NAND strings, consistent with FIG. 15A.

FIG. 15D depicts a voltage, Vbl_unsel, applied to bit lines of unselected NAND strings, consistent with FIG. 15A.

FIG. 15E depicts a voltage, Vsgd_sel, applied to SGD transistors of a selected sub-block, consistent with FIG. 15A.

FIG. 15F depicts voltages applied to SGD transistors of unselected sub-blocks and to SGS transistors, consistent with FIG. 15A.

FIG. 15G depicts a voltage applied to a source line, consistent with FIG. 15A.

FIG. 16A depicts a plot of program voltage versus temperature in a single bit per cell program operation, consistent with FIG. 13A, plots 1303a and 1303d, where the first program level is adjusted to Vpgm_L1a or Vpgm_L1b as a function of temperature.

FIG. 16B depicts a plot of program voltage versus a number of program-erase (P-E) cycles in a single bit per cell program operation, consistent with FIG. 13A, plots 1303a and 1303d, where the first program level is adjusted to Vpgm_L1a or Vpgm_L1b as a function of the number of P-E cycles.

FIG. 16C depicts a plot of program voltage versus a sub-block (SB) position in a single bit per cell program operation, consistent with FIG. 7C and FIG. 13A, plots 1303a and 1303d, where the first program level is adjusted to Vpgm_L1a or Vpgm_L1b as a function of the selected sub-block position in a block.

FIG. 16D depicts a plot of program voltage versus a selected word line position in a single bit per cell program operation, consistent with FIG. 13A, plots 1303a and 1303d, where the first program level is adjusted to Vpgm_L1a or Vpgm_L1b as a function of the selected word line position in a block.

DETAILED DESCRIPTION

Figure 1C:
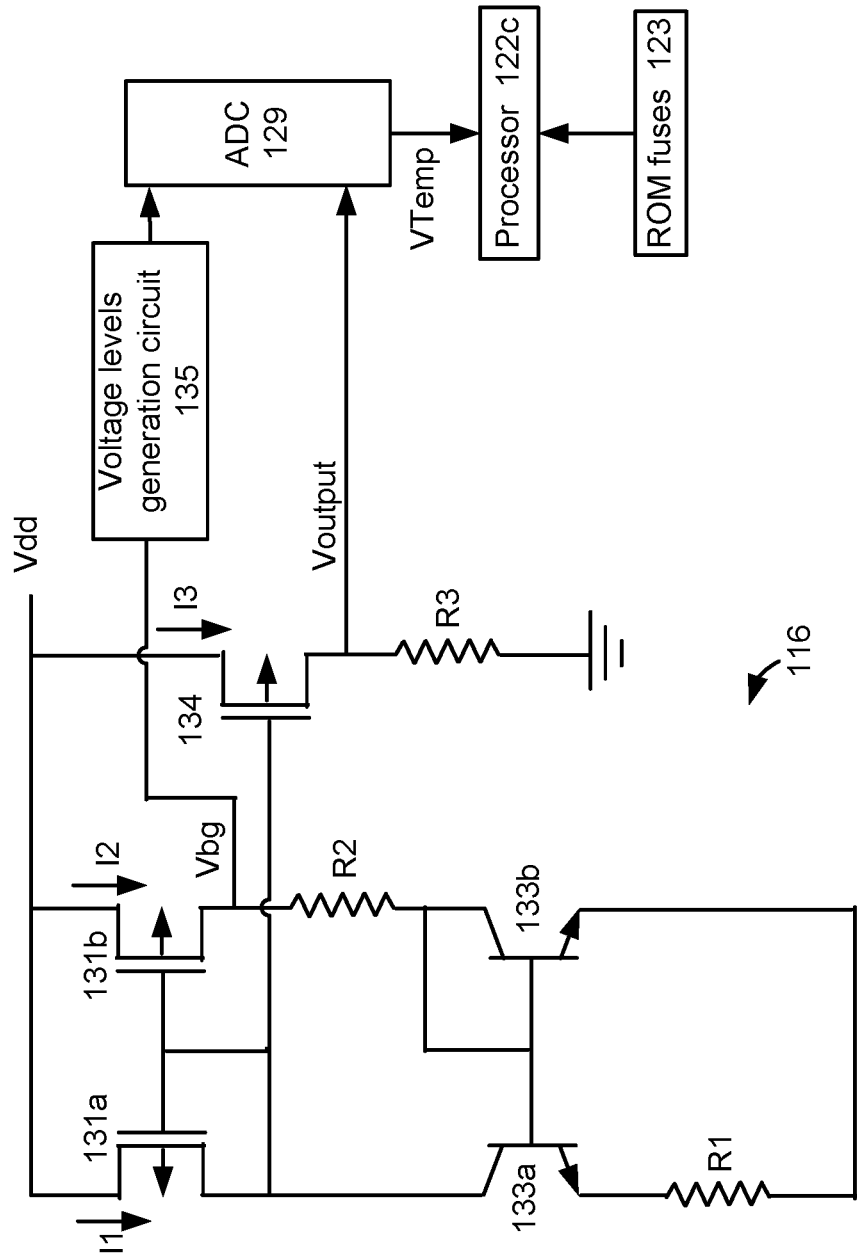
FIG. 1C depicts an example of the temperature-sensing circuit 116 of FIG. 1A.

Apparatuses and techniques are described for reducing damage to memory cells during single bit per cell programming.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The memory cells can include data memory cells, which are eligible to store user data, and dummy memory cells, which are ineligible to store user data. Dummy memory cells are used to reduce disturbs of data memory cells by providing buffer regions along the NAND string.

Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extends vertically in the stack. A source end of the NAND string is connected to the substrate and a drain end of the NAND string is connected to a bit line.

In particular, 3D NAND flash memory is widely used for storage in consumer devices, enterprise systems and industrial applications because of its non-volatility, affordability, high storage density and high access speed.

In a 2D memory structure, the memory cells may be arranged in horizontal NAND strings on a substrate.

Data can be stored in the memory cells by programming them to different data states which are represented by different ranges of threshold voltages (Vths). In a single bit per cell mode, also referred to as a single level cell (SLC) mode, one bit of data is stored in each memory cell. In a multiple bits per cell mode, also referred to as a multi-level cell (MLC) mode, multiple bits of data are stored in each memory cell. In some cases, memory cells in a block can transition back and forth between the SLC mode and the MLC mode. The SLC mode provides higher speed programming while the MLC mode provides higher density data storage. For example, a folding operation can be performed in which pages of data are written to memory cells in the SLC mode to allow for fast programming and then transferred to other memory cells in the MLC mode for longer term storage. For example, in a three bit per cell mode, three pages of data can be written to three respective blocks of cells in the SLC mode, then transferred to one block in the MLC mode. Each block may undergo three SLC cycles followed by one MLC cycle.

However, programming in the SLC mode can cause more damage to the memory cells than programming in the MLC mode in some cases. For example, traps can form in the tunnel oxide layer of the memory cells, forming a permanent conductive path which renders the memory cell unusable. Damage can occur to other layers as well. The damage is a function of the electric field E across the memory cell, where E$\alpha$Vpgm-Vth. Vpgm is the program voltage on the control gate of the memory cell and Vth is the threshold voltage of the memory cell. When an initial program pulse is applied, the Vth of the memory cell will be very low, at the erased state level, e.g., 0 V. The initial Vpgm for SLC programming is relatively high, e.g., 20 V, due to the desire to complete the SLC programming in one program pulse or a small number of program pulses such as one or two pulses to minimize the programming time. The initial Vpgm for the SLC mode can be higher than the initial Vpgm for the MLC mode, which is more incremental and uses several program pulses in a program operation.

Due to the greater damage in the SLC mode, the memory device can experience a significant loss of endurance. The ratio of the number of SLC cycles relative to the number of MLC cycles can fall below a desired standard.

Techniques provided herein address the above and other issues. In one aspect, an initial program pulse in the SLC program operation has a lower, first program level followed by a higher, second program level. Each program level provides a control gate-to-drain voltage for the memory cells which is sufficiently high to induce programming of the memory cells such as by Fowler-Nordheim (FN) tunneling. FN tunneling causes electrons to move from the channel to the charge-storing material of the memory cell. The first and second program levels may be preceded by a lower, pass level. A pass level is not sufficient to induce programming of the memory cells but is high enough to provide the memory cells in a conductive state, e.g., turn on the memory cells. The pass voltage is typically higher than the Vth of the highest programmed state. By applying the lower, first program level, the Vth of the memory cells can increase before the higher, second program level is applied. As a result, the magnitude of Vpgm-Vth is reduced compared to the case where only the higher program level is applied.

The initial program pulse can include a step up from the first program level to the second program level. To reduce the step up time, the voltages of the adjacent unselected word lines can be stepped up concurrently with the step up in the program pulse on the selected word line. This step up in the unselected word line voltages provides a capacitive coupling to the selected word line which reduces the step up time as well as the settling time on the selected word line.

If an additional program pulse is applied in the SLC program operation, the step up of the selected word line voltage and the adjacent unselected word line voltage can be omitted such that the program pulses has a single program level. Also, the step up of the selected word line voltage and the adjacent unselected word line voltage can be omitted in an MLC program operation.

The magnitude of the first program level can be adjusted based on factors such as temperature, number of program-erase cycles, selected sub-block position and selected word line position.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically, a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, a storage region 113, an on-chip address decoder 114, a power control circuit 115, a temperature-sensing circuit 116 and a P-E cycle tracking circuit 117.

In one embodiment, the state machine is programmable by operational parameters and software/code stored in the storage region 113. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

The temperature-sensing circuit 116 can sense a temperature of the memory device. See FIG. 1C for an example implementation of the temperature-sensing circuit. The circuits may include hardware, software and/or firmware for performing the processes described herein.

The P-E cycle tracking circuit 117 can track the number of program-erase (P-E) cycles of each block and classify the block into a category based the number of P-E cycles relative to one or more thresholds. SLC cycles and MLC cycles can be tracked.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, temperature-sensing circuit 116, P-E cycle tracking circuit 117, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. For example, see FIG. 8. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. For example, the control circuit can issue commands to the voltage drivers in FIG. 3 to provide the voltage signals described herein and to implement the techniques discussed herein.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 1C depicts an example of the temperature-sensing circuit 116 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122e. This is data indicating a temperature of the memory device. ROM fuses 123 store data which correlates the matching voltage level to a temperature, in one approach. The processor then uses the temperature to set temperature-based parameters in the memory device such as by using the comparison circuit.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIGS. 7A and 7B, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. A verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vsense+Vth, e.g., 1.5 V, to the control gate of the transistor 55 to provide Vsense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_unsel for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. For example, in a program-verify test, a 0 can denote fail and a 1 can denote pass. The bit in the sense node latch can be read out in a state bit scan operation of a scan operation, or flipped from 0 to 1 in a fill operation.

The bit in the sense node latch can also be used in a lockout scan to decide whether to set a bit line voltage to an inhibit or program level in a next program loop. The latches 194-197 may be considered to be data state latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
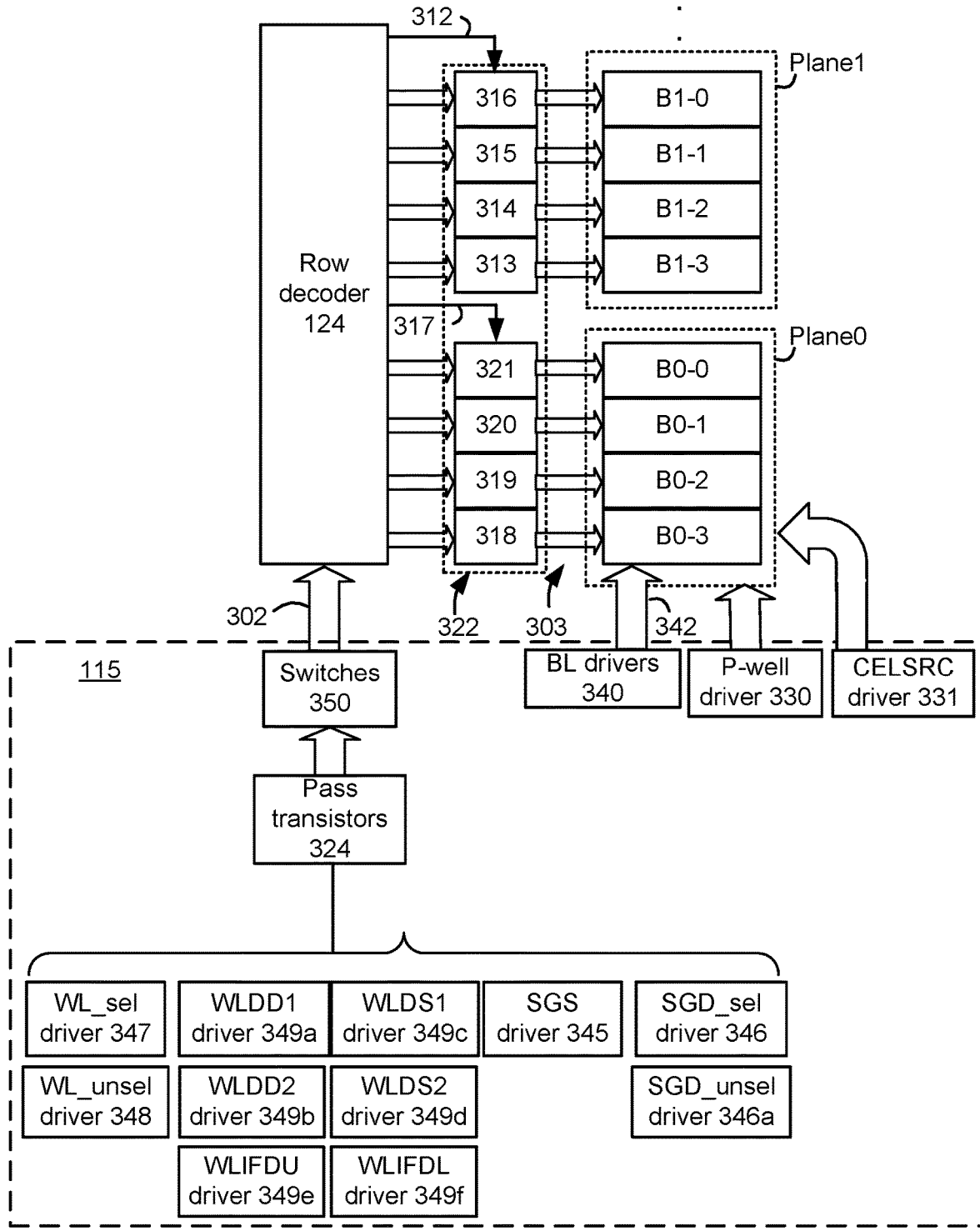
FIG. 3 depicts an example implementation of the power control circuit 115 of FIG. 1A for providing voltages to blocks of memory cells in a plane.

FIG. 3 depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, Plane0, and another set of four blocks, B1-0 to B1-3, in another plane, Plane1, consistent with FIG. 4. Plane2 and Plane3 in FIG. 4 are not depicted in this example. Generally, the blocks can be in one or more planes. The row decoder 124 of FIG. 1A provides voltages to word lines and select gate control lines of each block via pass transistors 322. In one approach, a separate row decoder is provided for each block. The row decoder can be provided one side of a block. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, which in turn are connected to control gate lines of B1-0 to B1-3, respectively. A control gate line 317 is connected to sets of pass transistors 318-321, which in turn are connected to control gate lines of B0-0 to B0-3, respectively.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL_sel driver 347, provides a voltage signal on a data word line which is selected during a program or read operation. As described herein, time periods which are allocated for various transitions in voltages can be optimized, e.g. for the WL_sel driver 347 and the BL voltage drivers 340.

The WL_unsel driver 348 provides a voltage signal on unselected data word lines. A number of drivers for dummy word lines can also be provided. For example, WLDD1, WLDD2, WLDS1, WLDS2, WLIFDU and WLIFDL drivers 349a-349f, respectively, provide a voltage signal on the first drain-side dummy word line WLDD1, the second drain-side dummy word line WLDD2, the first source-side dummy word line WLDS1, the second source-side dummy word line WLDS2, the upper interface dummy word line WLIFDU and the lower interface dummy word line WLIFDL, respectively. See FIGS. 6A and 6B. This is one example, as other examples are possible. In this example, there are two drain-side dummy word lines and two source-side dummy word lines, and two interface dummy word lines, where each dummy word line can receive an independent voltage signal. In another approach, multiple drain-side or source-side dummy word lines have their control gates connected so that they receive a common voltage signal.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD_unsel driver 346a for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 612b in the p-well region 612, e.g., via the conductive path 682. See FIG. 5A. In one approach, the p-well region is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+ contact 612c in the p-well region, e.g., via the local interconnect 651 in FIG. 6A.

Bit line (BL) voltage drivers 340 include voltage sources which provide voltages to the bit lines 342. The bit line voltage for sensing can be 0.5 V, for example.

FIG. 4 is a perspective view of an example memory die 400 consistent with FIG. 1A, where blocks of memory cells are provided in respective planes Plane0-Plane3, and a meta-block 410 comprises blocks B0-0 to B3-0. The memory die includes a substrate 401, an intermediate region 402 in which blocks of memory cells are formed, and an upper region 403 in which one or more upper metal layers are patterned such as to form bit lines. Planes Plane0-Plane3 represent respective isolation regions which are formed in the substrate 401. Further, blocks sequences 405, 415, 425 and 435 of a number n blocks, labelled B0-0 to B0-n−1, B1-0 to B1-n−1, B2-0 to B2-n−1 and B3-0 to B3-n−1, are formed in Plane0-Plane3, respectively. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. Moreover, the blocks of a meta-block can be read concurrently as a data unit in a multi-plane read operation. Typically, the same selected word line and page type are read in each block, and the read operations can occur concurrently or sequentially. The blocks in a meta-block may contain related data in some cases. The block of a meta-block can be arranged on a common die or extend across multiple die.

Similarly, the blocks of a meta-block can be programmed concurrently as a data unit in a multi-plane program operation.

The substrate 401 can also carry circuitry under the blocks, and one or more lower metal layers which are patterned in conductive paths to carry signals of the circuitry.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While four planes are depicted as an example, other examples can use fewer, e.g., two, planes or more, e.g., eight, planes. One plane per die is also possible.

While the above example is directed to a 3D memory device with vertically extending NAND strings, the techniques provided herein are also applicable to a 2D memory device in which the NAND strings extend horizontally on a substrate.

Figure 6A:
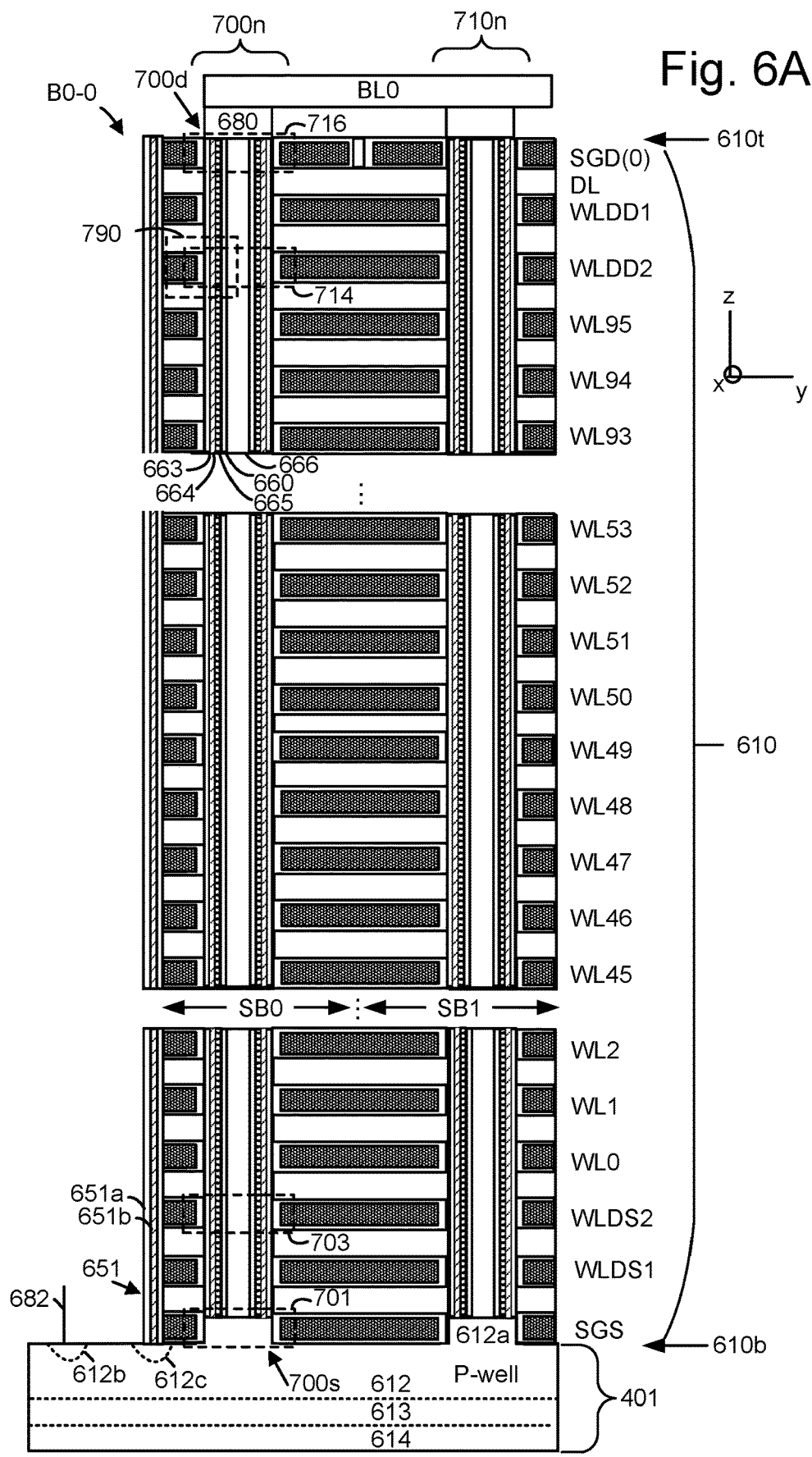
FIG. 6A depicts an example cross-sectional view of a portion of the block B0-0 of FIG. 4, including NAND strings 700n and 710n, in a single-tier stack.

FIG. 5 depicts an example transistor 520 in the memory structure 126 of FIG. 1A. The transistor comprises a control gate CG, a drain D, a source S and a channel CH and may represent a memory cell or a select gate transistor, for example. The control gate of the transistor is connected to a word line, the drain end of the transistor is connected to a bit line BL optionally via one or more other transistors in a NAND string, and the source end of the transistor is connected to a source line SL optionally via one or more other transistors in a NAND string, FIG. 6A depicts an example cross-sectional view of a portion of the block B0-0 of FIG. 4, including NAND strings 700n and 710n, in a single-tier stack. In this example, the NAND strings 700n and 710n are in different sub-blocks SB0 and SB1, respectively, and are connected to a common bit line, BL0. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS1, WLDS2, WL0-WL95, WLDD2, WLDD1 and SGD(0). The conductive layers connected to control gates of data memory cells are referred to as data word lines. A controller considers the data memory cells to be eligible to store user data. In this example, the stack includes ninety-six data word lines, WL0-WL95. The data word lines are separated by dielectric layers. DL is an example dielectric layer.

The conductive layers connected to control gates of dummy memory cells are referred to as dummy word lines. Dummy memory cells can have the same construction as data memory cells but are considered by the controller to be ineligible to store any type of data including user data. The dummy memory cells can provide a buffer region such as to provide a gradual transition in the channel voltage. This helps prevent disturbs of data memory cells. One or more dummy memory cells may be provided at the drain and/or source ends of a NAND string of memory cells. In a multi-tier stack, dummy memory cells can be provided adjacent to the interface, above and below the interface. For example, see FIG. 6B, and the upper and lower interface dummy word lines, WLIFDU and WLIFDL, respectively.

The conductive layers connected to control gates of source-side select gate transistors (SGS transistors) and drain-side select gate transistors (SGD transistors) are referred to as source-side and drain-side control lines, respectively. The SGD transistor is used to electrically connect the drain end of a NAND string to a bit line, and the SGS transistor is used to electrically connect the source end of a NAND string to a source line, as is appropriate during various operations including programming, erasing and reading.

A top 610t and bottom 610b of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, a topmost data memory cell 714 is formed where the WL95 word line intersects with the multiple thin layers, and a bottom most data memory cell 703 is formed where the WL0 word line intersects with the multiple thin layers.

The multiple thin layers can form annular layers and can be deposited, e.g., using atomic layer deposition. For example, the layers can include a blocking oxide layer 663, a charge-trapping layer 664 or film such as silicon nitride (Si3N4) or other nitride, a tunnel oxide layer 665 (e.g., a gate oxide) and a channel 660 (e.g., comprising polysilicon). A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 401. In one approach, the substrate includes a p-well region 612 (see also FIG. 3) connected to the source ends of the NAND strings. The p-well region may comprise epitaxial regions 612a which extend upward adjacent to the source-side select gate transistors. The p-well region can include an n+ contact 612c connected to a local interconnect 651 for receiving a source line voltage, and a p+ contact 612b connected to a conductive path 682 for receiving a p-well voltage. The local interconnect 651 can comprise a conductive material 651b such as metal surrounded by insulating material 651a to prevent conduction with the metal of the adjacent word lines. The p-well region is formed in an n-well 613, which in turn is formed in a p-type semiconductor region 614 of the substrate, in one possible implementation.

The NAND string 700n has a source end 700s at a bottom 610b of the stack 610, connected to the p-well. The NAND string 700n also has a drain end 700d at a top 610t of the stack, connected to a bit line BL0 via a bit line contact 680 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer, e.g., a tunnel oxide layer. The Vth of a memory cell is increased in proportion to the amount of stored charge. During an erase operation, the channels of the NAND string are charged up, such as by applying a positive erase pulse to the substrate via the local interconnect 651, causing the electrons to return to the channel from the charge trapping layer.

In this example, the SGS transistors do not include the multiple thin layers 660, 663, 664 and 665.

Figure 6B:
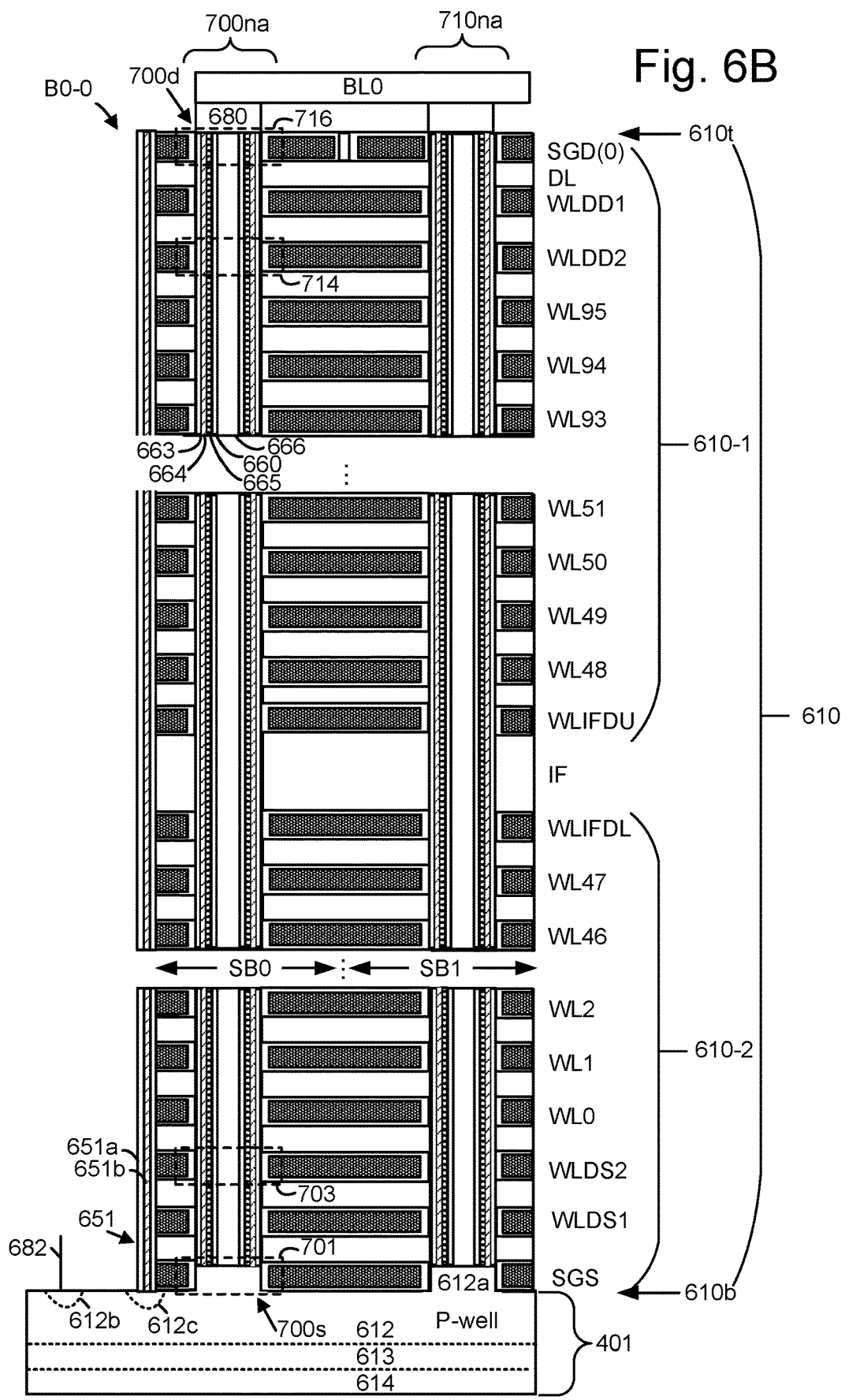
FIG. 6B depicts an example cross-sectional view of a portion of the block B0-0 of FIG. 4, including NAND strings 700na and 710na, in a two-tier stack comprising an upper tier 610-1 and a lower tier 610-2.

FIG. 6B depicts an example cross-sectional view of a portion of the block B0-0 of FIG. 4, including NAND strings 700na and 710na, in a two-tier stack comprising an upper tier 610-1 and a lower tier 610-2. A two-tier other multi-tier stack can be used to form a relatively tall stack while maintaining a relatively narrow memory hole width. After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole was etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines.

FIG. 6C depicts example plots of memory hole width versus height in the NAND string 700n of FIG. 6A. The width of a memory hole can vary in the vertical direction due to variations in the etching process. The solid line depicts an example in which the width is progressively greater higher in the memory hole, starting from a width w3 at the bottom of the memory hole and ending at a width w1 at a top of the memory hole. The dashed line depicts an example in which the width is progressively greater higher in the memory hole, starting from the width w3 at the bottom of the memory hole until a width w2 is reached partway along the memory hole. The width then decreases to w1 at the top of the memory hole. This is an example of bowing, which results in an enlargement of the memory hole diameter at a mid-range region of the hole, between the top and bottom. Other examples of abnormal profiles include striation (a vertical scratch on the sidewall), distortion and twisting.

For each selected word line, there will be an associated memory hole width which affects the electric field. Specifically, for a smaller memory hole width, a given program pulse magnitude will result in a greater electric field. When the multi-level program pulse is used as discussed herein, the first program level and/or the second program level can be smaller when the memory hole width is smaller. Also, a difference between the first program level and the second program level can be smaller when the memory hole width is smaller. The program pulse can therefore be optimized based on the memory hole width. To implement this approach, the program pulse can be optimized based on the selected word line position, which has a known correspondence with the memory hole width. For example, see FIGS. 16D and 17D.

FIG. 6D depicts example plots of memory hole width versus height in the NAND string 700na of FIG. 6B. The memory hole width for each tier is similar to the profile depicted in FIG. 7A. For the bottom tier (BT), a solid line depicts an example in which the width is progressively greater higher in the memory hole, starting from a width w6 at the bottom of the tier and ending at a width w4 at a top of the tier. The dashed line depicts an example in which the width is progressively greater higher in the memory hole, starting from the width w6 at the bottom of the memory hole until a width w5 is reached partway along the bottom tier. The width then decreases to w4 at the top of the bottom tier.

For the top tier (TT), a solid line depicts an example in which the width is progressively greater higher in the memory hole, starting from a width w6 at the bottom of the tier and ending at a width w4 at a top of the tier. The dashed line depicts an example in which the width is progressively greater higher in the memory hole, starting from the width w6 at the bottom of the tier until a width w5 is reached partway along the top tier. The width then decreases to w4 at the top of the top tier.

As discussed, the magnitude of the first and/or second program levels of the program pulse can be optimized based on the height/position of the selected word line in the block and the associated memory hole width.

FIG. 7A depicts an example view of NAND strings in the block B0-0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line and sub-block programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

In an erase operation, typically the entire block is erased, although a partial block erase is also possible.

The plurality of memory cells of B0-0 are arranged in NAND strings, where each NAND string comprising a continuous charge trapping layer along a length of the NAND string. The NAND strings 700n, 710n, 720n and 730n have channels 700a, 710a, 720a and 730a, respectively. Additionally, NAND string 700n includes SGS transistor 701, source-side dummy memory cells 702 and 703, data memory cells 704-713, drain-side dummy memory cells 714 and 715 and SGD transistor 716. NAND string 710n includes SGS transistor 721, source-side dummy memory cells 722 and 723, data memory cells 724-733, drain-side dummy memory cells 734 and 735 and SGD transistor 736. NAND string 720n includes SGS transistor 741, source-side dummy memory cells 742 and 743, data memory cells 744-753, drain-side dummy memory cells 754 and 755 and SGD transistor 756. NAND string 730n includes SGS transistor 761, source-side dummy memory cells 762 and 763, data memory cells 764-773, drain-side dummy memory cell 774 and 775 and SGD transistor 776.

This example depicts one SGD transistor at the drain end of each NAND string, and one SGS transistor at the source end of each NAND string, but multiple SGS and/or SGD transistors could be provided in each NAND string. In one approach, multiple SGD transistors in a NAND string have their control gates connected so that that are driven by a common voltage signal. Multiple SGS transistors in a NAND string can similarly have their control gates connected. The SGD transistors in SB0, SB1, SB2 and SB3 may be driven by separate control lines SGD(0), SGD(1), SGD (2) and SGD(3), respectively, in one approach.

FIG. 7B depicts an example top view of the block B0-0 of FIG. 7A, with respective NAND strings, bit lines and sense circuits. The view is in the x-y plane. Each circle represents a NAND string. In this example, sixteen NAND strings per sub-block are depicted. SB0 includes the NAND string 700n of FIG. 7A and additional NAND strings 700n1-700n15. SB1 includes the NAND string 710n of FIG. 7A and additional NAND strings 710n1-710n15. SB2 includes the NAND string 720n of FIG. 7A and additional NAND strings 720n1-720n15. SB3 includes the NAND string 730n of FIG. 7A and additional NAND strings 730n1-730n15.

A set of bit lines BL0-BL15 are connected to the NAND strings. Each bit line is connected to a respective set of NAND strings, including one NAND string in each sub-block. For example, BL0 is connected to NAND strings 700n, 710n, 720n and 730n in a set of NAND strings 799, BL1 is connected to NAND strings 700n1, 710n1, 720n1 and 730n1, and so forth. Each bit line is also connected to a respective sense circuit, consistent with the sense circuits 60-63 of FIG. 2. For example, BL0-BL15 are connected to sense circuits SC0-SC15, respectively.

FIG. 7C depicts the region 799 of FIG. 7B in further detail, showing the varying thickness of a blocking oxide layer in different sub-blocks. The region includes the four example NAND strings or memory holes, including NAND strings 700n, 710n, 720n and 730n. Each NAND string includes the components depicted in FIG. 6, including the blocking oxide layer 663, the charge-trapping layer 664, the tunnel oxide layer 665, the channel 660 and the dielectric core 666. The thickness of the blocking oxide layer can vary based on the position of a NAND string in a block, e.g., based on the sub-block in which the NAND string is located. This variation is due to the fabrication process, in which an etchant is introduced at the edges 797 and 798 of the block. When the etchant is introduced, the oxide between the word line layers is removed. However, a portion of the etchant can inadvertently remove part of the blocking oxide layer 663, reducing its thickness. Moreover, this thinning process is stronger for NAND strings which are closer to the edges of the block. As a result, the thickness of the blocking oxide layer 663 is less for NAND strings in the edge sub-blocks, SB0 and SB3, than in the interior sub-blocks, SB1 and SB2. The thickness of the blocking oxide layer is represented by Th1 for the NAND strings 700n and 730n and by Th2>Th1 for the NAND strings 710n and 720n.

The NAND strings with the thinner blocking oxide layer are more subject to damage during programming due in part to a resulting greater electric field. To compensate for this, the magnitude of the first and/or second program levels of the program pulse can be optimized based on the position of the selected sub-block which is being programmed.

Figure 8:
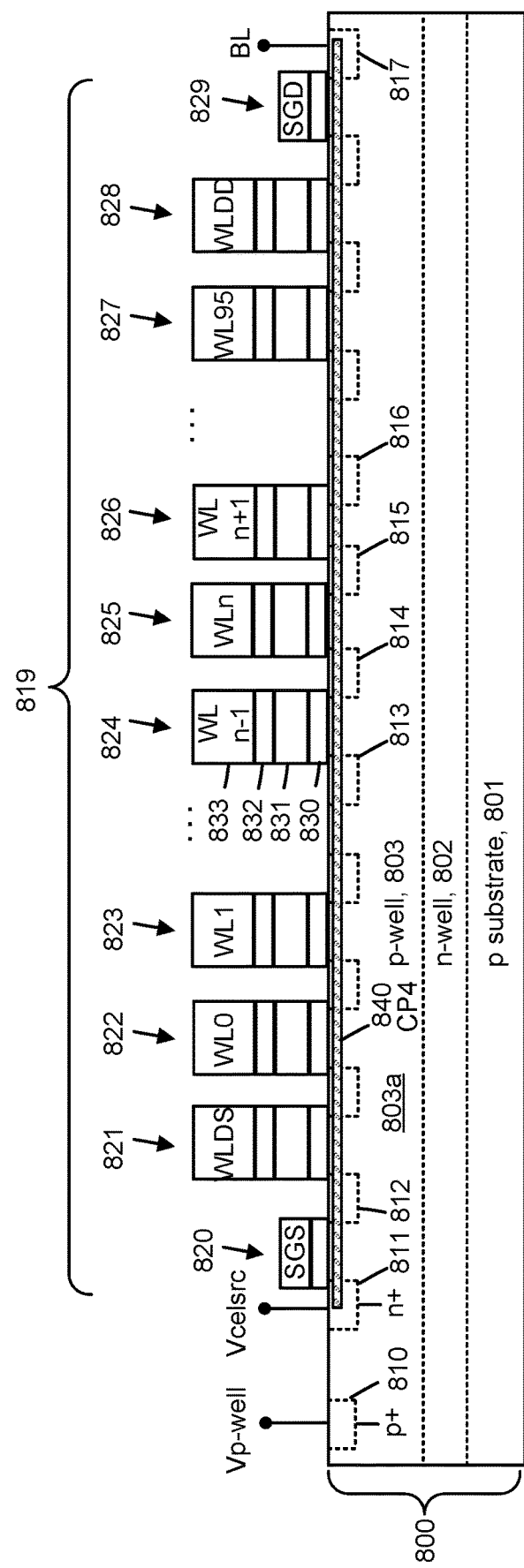
FIG. 8 depicts an example NAND string in a 2D configuration.

FIG. 8 depicts an example NAND string in a 2D configuration. The techniques discussed herein can be used in a 2D memory device as well as the above-described 3D memory device. The channel in a 2D memory device extends horizontally in the substrate rather than in a vertically extending channel layer. In this example, a substrate 800 includes a p-well 803 within an n-well 802, which in turn is in a p substrate 801. Vp-well and Vcelsrc are provided to the p-well via contacts 810 and 811, respectively. The contact 811 is a source line. The erase pulse can be Vp-well. A NAND string 819 is arranged on the substrate and include select gate transistors and memory cells. For example, the NAND string includes a SGS transistor 820, memory cells 821, 822 and 823 connected to WLDS, WL0 and WL1, respectively, memory cells 824, 825 and 826 connected to WLn−1, WLn and WLn+1, respectively, memory cells 827 and 828 connected to WL95 and WLDD, respectively, and a SGD transistor 829. Doped regions in the substrate, such as example doped regions 811-817, act as sources and drains of the transistors. Vbl is provided to the doped region 817. When appropriate voltages are provided to the NAND string, an inversion layer or channel 840 is formed in the p-well. A remaining portion 803a of the p-well is biased at Vp-well.

The example memory cell 824 comprises a tunnel oxide layer 830, a floating gate layer 831, a blocking oxide layer 832 and a control gate 833.

Figure 9A:
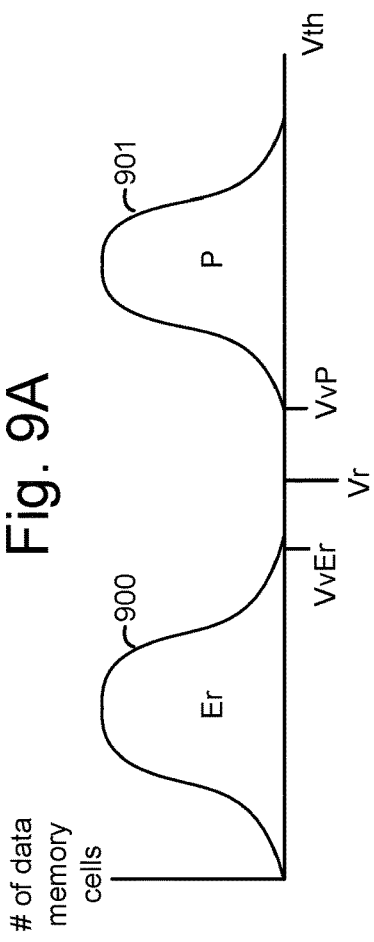
FIG. 9A depicts threshold voltage (Vth) distributions for data memory cells in a two-state or single bit per cell memory device.

FIG. 9A depicts threshold voltage (Vth) distributions for data memory cells in a two-state or single bit per cell memory device. After a block of memory cells is erased, the memory cells have the Vth distribution 900 of the erased state (Er). The erase operation biases the memory cells with a positive channel-to-gate voltage until the Vth is detected to decrease below an erase-verify voltage, VvEr. Subsequently, based on the data to be programmed, some of the memory cells remain in the erased state, such as to represent a 1 bit, while other memory cells are programmed to a programmed (P) state, such as to represent a 0 bit. The P state is represented by the Vth distribution 901. The program operation biases the memory cells with a positive gate-to-channel voltage until the Vth is detected to increase above a program-verify voltage, VvP.

Figure 9B:
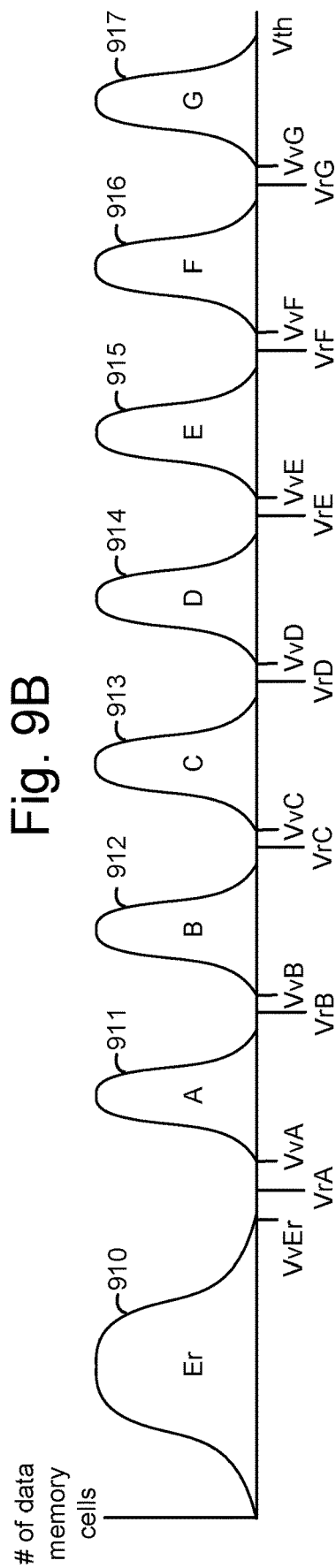
FIG. 9B depicts threshold voltage (Vth) distributions for data memory cells in an eight-state or three bit per cell memory device.

FIG. 9B depicts threshold voltage (Vth) distributions for data memory cells in an eight-state or a three bit per cell memory device. Eight data states, or three bits per cell, are depicted as an example on an MLC mode. The techniques herein can apply to MLC modes including two or more bits per cell. The vertical axis depicts a number of memory cells on a logarithmic scale and the horizontal axis depicts a threshold voltage on a linear scale. The Vth distributions can represent memory cells connected to a word line. After erasing the block, the Vth distribution 910 is obtained, representing the erased state. The erase operation is completed when the Vth of all, or nearly all, of the data memory cells is below an erase verify voltage, VvEr.

The memory cells are then subject to a programming operation. Each of the memory cells has an assigned data state. Some of the memory cells are assigned to the erased state and are not programmed. Most of the memory cells are programmed to higher states, such as A-F, in this example, as represented by Vth distributions 911-917, respectively. These memory cells are subject to verify tests using verify voltages of VvA-VvG. The data states which are reached by programming, e.g., the A-F states, are referred to as programmed data states. The memory cells which are assigned to a programmed data state complete programming when all, or nearly all, e.g., at least 95-99%, of the memory cells have a Vth greater than the verify voltage. A lockout condition is reached for a memory cell when its Vth is greater than the verify voltage, such that the memory cell passes its verify test.

The memory cells can later be read in a read operation using the A-G state read voltages, VrA-VrG, respectively. A read operation occurs for a page of data and involves one or more read voltages. In one approach, a lower page read involves VrD, a middle page read involves VrF, VrC and VrA, and an upper page read involves VrG, VrE and VrB. In another approach, a lower page read involves VrA and VrE, a middle page read involves VrB, VrD and VrF, and an upper page read involves VrC and VrG.

Figure 10:
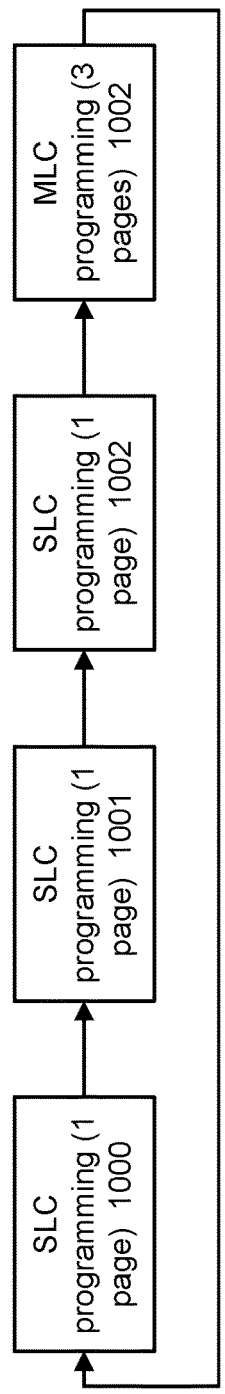
FIG. 10 depicts a sequence of programming a block in a single bit per cell (SLC) mode and in a multiple bits per cell (MLC) mode.

FIG. 10 depicts a sequence of programming a block in a single bit per cell (SLC) mode and in a multiple bits per cell (MLC) mode. As mentioned at the outset, memory cells can transition back and forth between an SLC mode and an MLC mode such as in a folding operation. Multiple pages of data can be programmed in the SLC mode. For example, first, second and third pages are programmed in the SLC mode as depicted by the blocks 1000, 1001 and 1002, respectively. Subsequently, the pages of data can be read and programmed in an MLC mode, e.g., with three bits per page, as depicted by the block 1002. This cycle can then be repeated. In one approach, three different word lines in a block can store the three pages in the SLC mode, with one page per word line. The data can be read and programmed to another word line in the block in the MLC mode. In another approach, three different blocks can store the three pages in the SLC mode, with one page per block. The data can be read and programmed to another word line in another block in the MLC mode.

In one approach, a word line or block can periodically transition between the SLC and MLC modes to provide a uniform level of wear. For example, X P-E cycles in the SLC mode can be performed followed by Y cycles in the MLC mode, where X and Y are designated numbers. When the SLC mode results in greater damage than the MLC mode, X<Y.

Figure 11A:
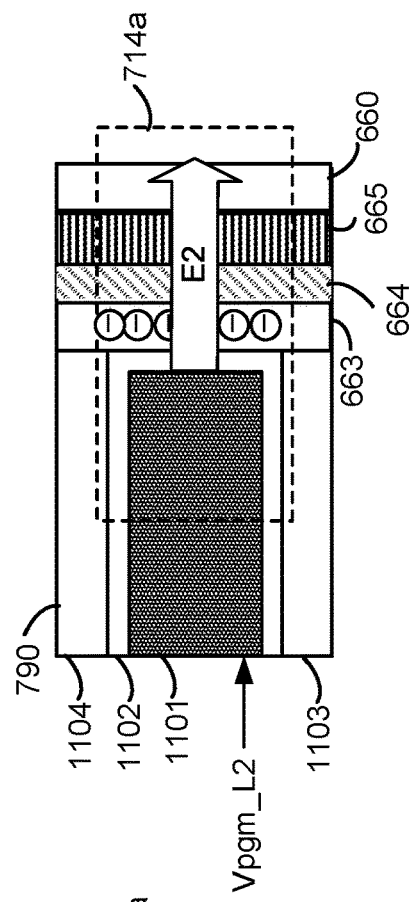
FIG. 11A depicts the region 790 of the block B0-0 of FIG. 6A, including a portion 714a of the example memory cell 714, after programming with a first program level, Vpgm_L1.

FIG. 11A depicts the region 790 of the block B0-0 of FIG. 6A, including a portion 714a of the example memory cell 714, after programming with a first program level, Vpgm_L1. The portion of the memory cell includes portions of the blocking oxide layer 663, charge-trapping layer 664, tunnel oxide layer 665 and the channel 660. An oxide region 1102 also surrounds the metal 1101 of the word line. Dielectric regions 1103 and 1104 are below the word line and above the word line, respectively. When the first program level, Vpgm_L1, is applied to the word line, an electric field E1 is formed between the word line and the channel. E1 is sufficiently high to induce programming of the memory cell, as demonstrated by electrons which move into the charge-trapping layer 664. The example electrons are represented by a line in a circle.

As mentioned previously, the electric field is a function of Vpgm-Vth. If the memory cell is initially in the erased state, the Vth may be 0 or −1 V, for example. If Vpgm_L1=18 V, for example, E1=18−0=18 V. The application of Vpgm_L1 increases the Vth of the memory cell, e.g., to 1-3 V.

Figure 11B:
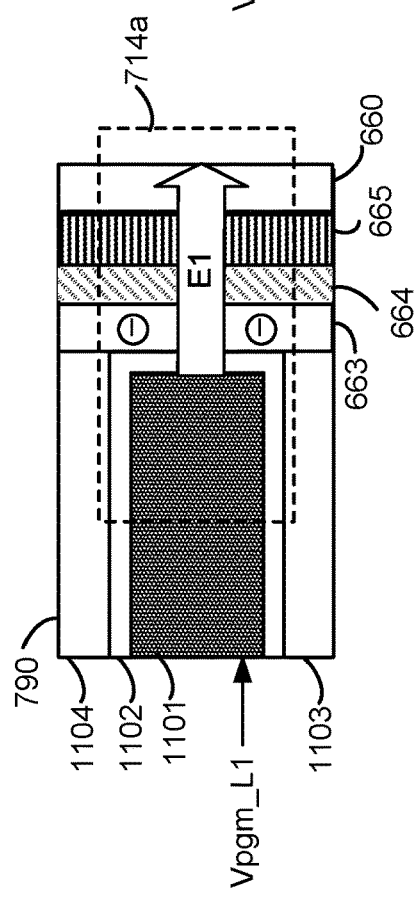
FIG. 11B depicts the portion 714a of the example memory cell 714 of FIG. 11A after additional programming with a second program level, Vpgm_L2.

FIG. 11B depicts the portion 714a of the example memory cell 714 of FIG. 11A after additional programming with a second program level, Vpgm_L2. When a program voltage at a second program level of Vpgm_L2, e.g., 20 V, is applied to the word line, an electric field E2 is formed between the word line and the channel. E2=20−2=18 V, for example. E2 is sufficiently high to induce further programming of the memory cell, as demonstrated by additional electrons which move into the charge-trapping layer 664. In this example, E1=E2. However, other options are possible. In contrast, if a single level pulse of 20 V was applied with Vth=0 V, a higher, more damaging electric field such as 20−0=20 V occurs.

Figure 12A:
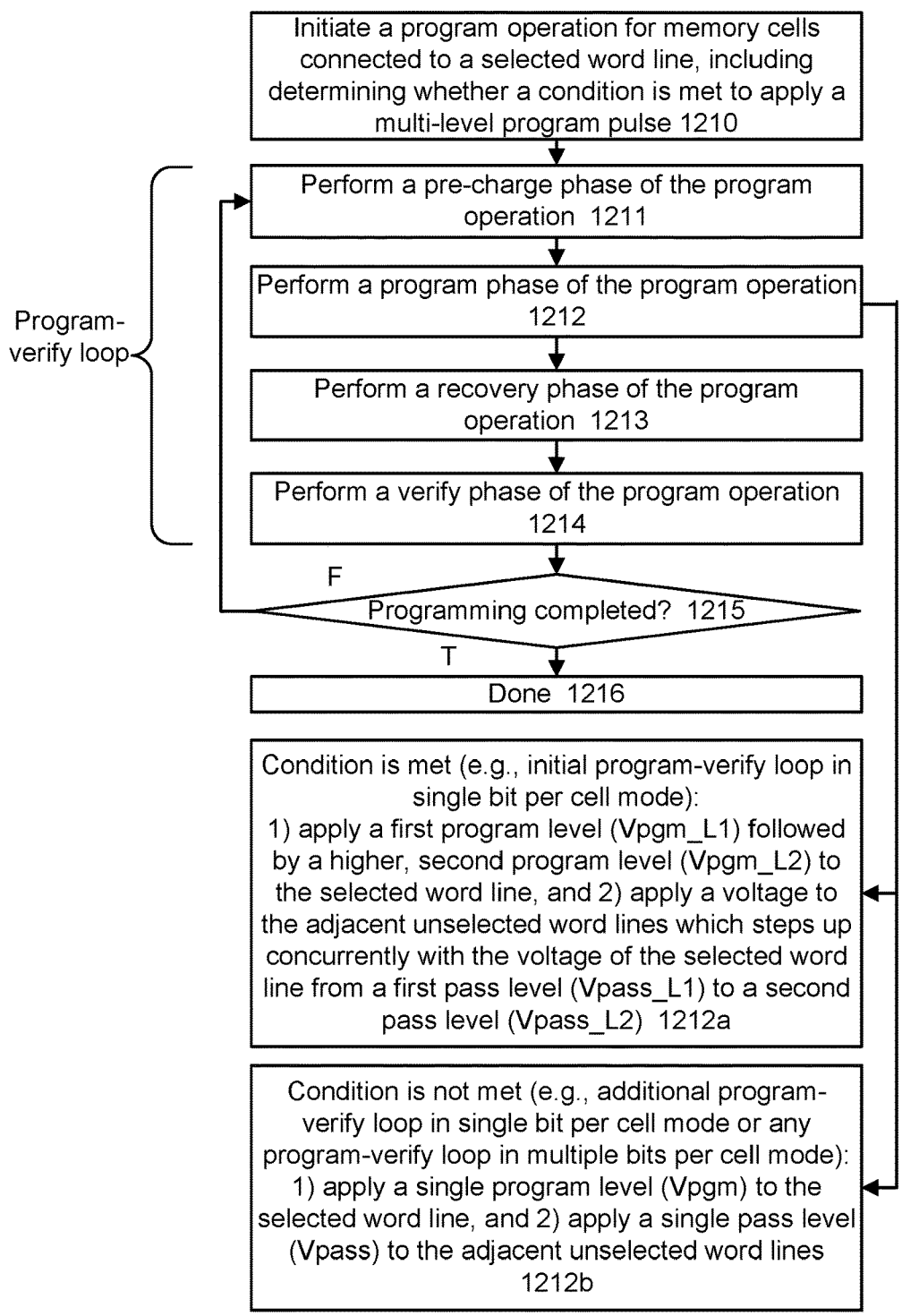
FIG. 12A depicts an example sequence for programming a block of memory cells in a single bit per cell mode with a multiple bits per cell mode.

FIG. 12A depicts an example sequence for programming a block of memory cells in a single bit per cell mode with a multiple bits per cell mode. As mentioned, a set of cells such as a block of cells or cells connected to a word line can transition back and forth between a single bit per cell mode and a multiple bits per cell mode. In this example, a block 1200 depicts programming a block in a single bit per cell mode using a program damage countermeasure, such as a multi-level program pulse as discussed herein. A block 1201 denotes changing the mode. A block 1202 denotes programming the block in a multiple bits per cell mode, e.g., without the program damage countermeasure. One approach is to transition a word line or block to provide a uniform level of wear based on the number of P-E cycles in the SLC and MLC modes. In some cases, the amount of damage to the memory cells is greater in the SLC mode such that fewer P-E cycles can be performed in the SLC mode than in the MLC mode before the memory cells are retired from use. The retirement can be based on reaching a specified number of P-E cycles in the SLC and MLC modes, for example.

FIG. 12B depicts a flowchart of an example process for programming memory cells in a single bit per cell mode with a damage reduction countermeasure, and in a multiple bits per cell mode without the damage reduction countermeasure. Step 1210 involves initiating a program operation for memory cells connected to a selected word line, including determining whether a condition is met to apply a multi-level program pulse to the memory cells. In one approach, the condition is met when the current program-verify loop is the initial program-verify loop of a program operation in the SLC mode. In another approach, the condition is met when the memory cells connected to the selected word line are programmed in the SLC mode but not in the MLC mode.

Steps 1211-1214 are part of a program-verify loop or program loop. Step 1211 includes performing a pre-charge phase of the program operation. The pre-charge phase provides a small amount of channel boosting in the unselected NAND strings. The drain and/or source end select gate transistors can be provided in a conductive state while a small voltage such as 1-2 V is applied to the bit lines and/or the source line. This boosting is augmented by the capacitive coupling up of the channel which occurs during the program phase when the unselected word line voltages increase to a relatively high pass voltage.

Step 1212 includes performing a program phase of the program operation. The program phase involves applying a program pulse to the selected word line to induce programming of the associated memory cells. The program phase also involves increasing the voltages of the unselected word lines to Vpass to capacitively couple up the channel voltage. The drain and source end select gate transistors can be provided in a non-conductive state so that the channel voltage is floating and can therefore be capacitively coupled up.

In one option of the process, step 1212 can be implemented as depicted in step 1212a when the condition of step 1210 is met (e.g., for an initial program-verify loop in the single bit per cell mode). This step includes: 1) applying a first program level (Vpgm_L1) followed by a second program level (Vpgm_L2) to the selected word line, and 2) applying a voltage to the adjacent unselected word lines which steps up concurrently with the voltage of the selected word line from a first pass level (Vpass_L1) to a second pass level (Vpass_L2).

In another option of the process, step 1212 can be implemented as depicted in step 1212b when the condition of step 1210 is not met (e.g., for an additional program-verify loop in single bit per cell mode, e.g., any program-verify loop after the initial program loop which is handled in step 1211a, or for any program-verify loop in the multiple bits per cell mode). This step includes: 1) applying a single program level (Vpgm) to the selected word line, and 2) applying a single pass level (Vpass) to the adjacent unselected word lines.

Step 1213 includes performing a recovery phase of the program operation. In this phase, the word lines voltages can be ramped down from the relatively high levels of Vpass or Vpgm to a lower level at or close to 0 V. In one approach, the voltages are ramped down to a positive recovery or transition voltage, Vpass2Vread, before increasing to Vread in the verify phase.

Step 1214 includes performing a verify phase of the program operation. In the verify phase, one or more verify tests are performed. For each verify test, a verify voltage is applied to the selected word line while the conductive or non-conductive state of the selected memory cells is sensed. For SLC programming, there is a single verify test in a program-verify iteration using VvP, such as depicted in FIG. 9A. For MLC, there can be multiple verify tests in a program-verify iteration using verify voltages such as depicted in FIG. 9B.

A decision step 1215 determines whether programming is completed. Programming is completed when all, or nearly all, of the memory cells have passed their verify test. If the decision step 1215 is true (T), the program operation is done at step 1216. If the decision step 1215 is false, another program-verify loop is performed by returning to step 1211. The program voltage can be stepped up with each successive program-verify loop.

See FIG. 13A-15G for example voltage signals consistent with the process of FIG. 12B.

Figure 12C:
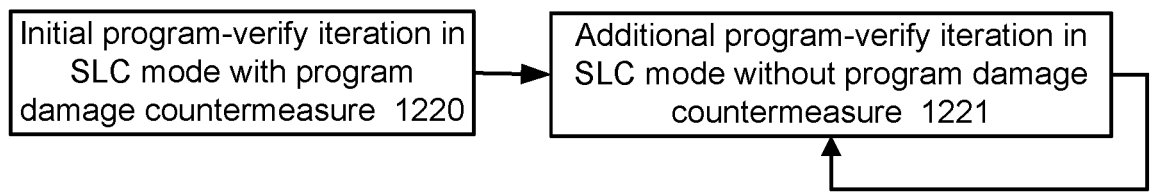
FIG. 12C depicts an example SLC programming sequence consistent with FIG. 12B, steps 1212a and 1212b.

FIG. 12C depicts an example SLC programming sequence consistent with FIG. 12B, steps 1212a and 1212b. The block 1220 represents the step of performing an initial program-verify iteration in the SLC mode with a program damage countermeasure, e.g., a multi-level program pulse. The block 1221 is optional, as programming may be completed after the block 1220.

In one aspect, the step can be implemented by a control circuit which is configured to perform an initial program-verify iteration of a program operation, wherein to perform the initial program-verify iteration, the control circuit is configured to bias the memory cells with a first control gate-to-drain voltage (e.g., Vpgm_L1 on the control gate and Vbl=0 V on the drain) followed by a second control gate-to-drain voltage (e.g., Vpgm_L2 on the control gate and Vbl=0 V on the drain) which is higher than the first control gate-to-drain voltage, followed by performing a verify test for the memory cells connected to the selected word line (e.g., using VvP), where the first control gate-to-drain voltage and the second control gate-to-drain voltage induce programming of the memory cells connected to the selected word line.

To bias the memory cells with the first control gate-to-drain voltage followed by the second control gate-to-drain voltage, the control circuit can be configured to apply a voltage at a first program level (Vpgm_L1) followed by a second program level (Vpgm_L2), higher than the first program level, to the selected word line.

To bias the memory cells with the first control gate-to-drain voltage followed by the second control gate-to-drain voltage, the control circuit can be configured to apply a first drain voltage (Vbl2) followed by a second drain voltage (Vbl1), lower than the first drain voltage, to the memory cells connected to the selected word line.

To bias the memory cells with the first control gate-to-drain voltage followed by the second control gate-to-drain voltage, the control circuit can be configured to apply a voltage at a fixed level (Vpgm=Vpgm_L2) to the selected word line while applying the first drain voltage followed by the second drain voltage.

The block 1221 represents the step of performing an additional program-verify iteration in the SLC mode without the program damage countermeasure. The programming may be completed after one additional program-verify iteration, or the step of block 1221 may be repeated until the programming is completed.

In one aspect, the step can be implemented by a control circuit which is configured to perform an additional program-verify iteration of the program operation, wherein to perform the additional program-verify iteration, the control circuit is configured to bias the memory cells with a single control gate-to-drain voltage (e.g., Vpgm on the control gate and Vbl=0 V on the drain, where Vpgm>Vpgm_L2) which induces programming of the memory cells connected to the selected word line, where the single control gate-to-drain voltage is higher than the second control gate-to-drain voltage, followed by performing a verify test for the memory cells connected to the selected word line (e.g., using VvP).

Figure 12D:
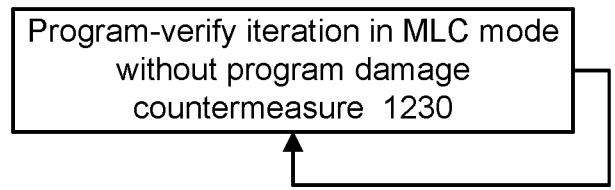
FIG. 12D depicts an example MLC programming sequence consistent with FIG. 12B, step 1212b.

FIG. 12D depicts an example MLC programming sequence consistent with FIG. 12B, step 1212b. The block 1230 represents the step of performing a program-verify iteration in the MLC mode without the program damage countermeasure. The programming is completed after several iterations of the step.

In one aspect, the step can be implemented by a control circuit which is configured to perform a program-verify iteration of a program operation, wherein to perform the program-verify iteration, the control circuit is configured to bias the memory cells with a single control gate-to-drain voltage (e.g., Vpgm on the control gate and Vbl=0 V on the drain) which induces programming of the memory cells connected to the selected word line, followed by performing a verify test for the memory cells connected to the selected word line (e.g., using one or more of VvA-VvG).

In FIG. 13A-13G, the vertical dimension denotes voltage and the horizontal dimension denotes time, with time points t0-t12. The period of time depicted corresponds to one program loop or program-verify iteration and includes a pre-charge phase 1311 (t0-t2), a program phase 1312 (t2-t4), a recovery phase 1313 (t4-t9) and a verify phase 1314 (t9-t12). The voltages depicted are examples.

Figure 13A:
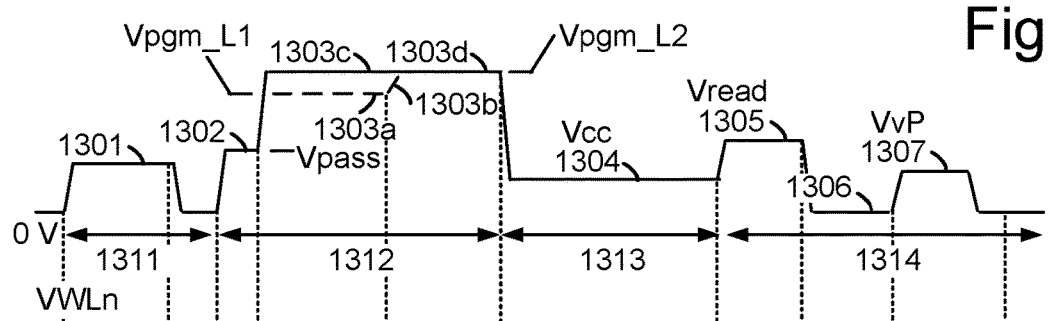
FIG. 13A depicts voltages applied to a selected word line, WLn in a program loop of a program operation in a single bit per cell mode, consistent with FIG. 12, steps 1212a and 1212b, where the program pulse has two program levels, Vpgm_L1 and Vpgm_L2.

FIG. 13A depicts voltages applied to a selected word line, WLn in a program loop of a program operation in a single bit per cell mode, consistent with FIG. 12, steps 1212a and 1212b, where the program pulse has two program levels, Vpgm_L1 and Vpgm_L2.

In the pre-charge phase, a plot 1301 represents a turn on voltage, e.g., 6 V, for the memory cells.

In the program phase, a plot 1302 represents a program pass voltage, Vpass, a plot 1303a represents a first program level of Vpgm_L1, and plots 1303c and 1303d represent a second program level of Vpg_L2. As discussed, in one option, the program levels of Vpgm_L1 and Vpgm_L2 (plots 1303a and 1303d) are used in a multi-step program pulse to reduce damage to memory cells in the SLC mode. The plot 1303b represents a step up or ramp up from the plot 1303a to the plot 1303d. For example, the voltage signal of FIG. 13A can occur in an initial program-verify loop. In some cases, the SLC programming is completed in the initial program-verify loop so there is no additional program-verify loop. If there is an additional program-verify loop, in one approach, a single level program pulse is used with the level of Vpgm_L2 (plots 1303c and 1303d).

In one example, Vpgm_L1=16-18 V and Vpgm_L2=18-20 V, and Vpgm_L2 may be 2-4 V greater than Vpgm_L1.

The single level program pulse can also be used in each program-verify iteration of an MLC program operation. Or, in one option for MLC programming, damage can be reduced by using the multi-level program pulse in the initial program-verify iteration and using the single level program pulse in the additional program-verify iterations.

Note that the multi-level program pulse refers to multiple program voltage levels which are greater than the pass voltage of plot 1302. The single level program pulse refers to a single program voltage level which is greater than the pass voltage of plot 1302. In one approach, the same time period t2-t4 is used for both the single level pulse and the multi-level pulse.

In an example implementation, to apply the multi-level program pulse to the memory cells connected to the selected word line, the control circuit is configured to ramp up a voltage of the selected word line from an initial level (e.g., 0 V) to a pass voltage (Vpass), from the pass voltage to the first program level (Vpgm_L1) and from the first program level to the second program level (Vpgm_L2). To apply the single level program pulse to the memory cells connected to the selected word line, the control circuit is configured to ramp up a voltage of the selected word line from the initial level (e.g., 0 V) to the pass voltage (Vpass), and from the pass voltage directly to a peak program level (Vpgm).

In the recovery phase, a plot 1304 represents a positive recovery voltage of Vcc=3 V. In the verify phase, a plot 1305 represents a voltage pulse at Vread. The voltage is then reduced to, e.g., 0 V at plot 1306 and increased to VvP at plot 1307.

During the application of the verify voltage, a sensing operation occurs for the memory cells which are assigned to the programmed state. The selected memory cells are connected to a selected word line, and can be in a selected sub-block.

Figure 13B:
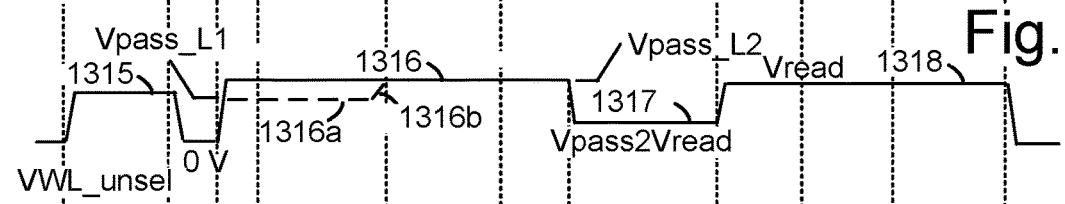
FIG. 13B depicts a voltage, VWL_unsel, applied to unselected word lines, consistent with FIG. 13A.

FIG. 13B depicts a voltage, VWL_unsel, applied to unselected word lines, consistent with FIG. 13A. A plot 1315 represents a turn on voltage such as 6 V, a plot 1316 represents Vpass_L2=8 V, a plot 1316a represents Vpass_L1, a plot 1317 represents Vpass2Vread and a plot 1318 represents Vread, e.g., 8 V. A plot 1316b represents a step up or increase of the pass voltage at t3a which is concurrent with the step up in the program voltage. The plots 1316a, 1316b and part of 1316 represent a multi-level pass voltage. In one approach, the step up in the pass voltage is provided for the adjacent word lines WLn−1 and WLn+1 of WLn, the selected word line. As mentioned, this step up couples up the voltage on the selected word line, so that the voltage on the selected word line steps up faster from Vpgm_L1 to Vpgm_L2 and settles faster at Vpgm_L2. A fixed pass voltage represented by the plot 1316 can be provided for the remaining word lines.

Figure 13C:
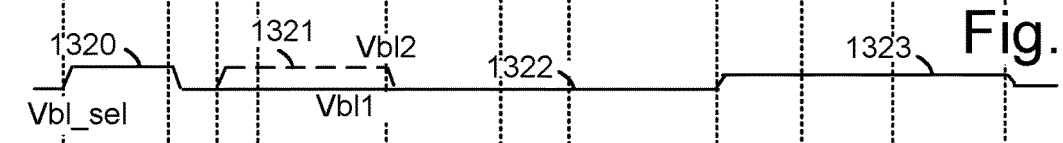
FIG. 13C depicts a voltage, Vbl_sel, applied to bit lines of programmed NAND strings, consistent with FIG. 13A.

FIG. 13C depicts a voltage, Vbl_sel, applied to bit lines of programmed NAND strings, consistent with FIG. 13A. A plot 1320 represents a pre-charge voltage of, e.g., 1 V, a plot 1322 represents Vbl1=0.5 V, and a plot 1323 represents Vsense=0.8 V. Optionally, a plot 1321 represents an elevated bit line voltage (Vbl2>Vbl1) which is concurrent with the first program level of Vpgm_L1 (plot 1303a). Increasing the bit line voltage has a similar effect on the gate-to-drain voltage of a memory cell as decreasing the control gate voltage. In one approach, VWLn is kept at Vpgm_L2 from t3-t4 while Vbl_sel=Vbl2 from t3-t3a. This can be equivalent to applying Vpgm_L1 at t3-t3a while Vbl_sel=0 V, if the difference between Vpgm_L1 and Vpgm_L2 is equal to the difference between Vbl1 and Vbl2. In this option, the bit line voltage is lowered at t3a instead of increasing the selected word line voltage. This approach could reduce programming time depending on factors such as the capacitance of the bit line compared to the capacitance of the selected word line.

It is also possible to apply the elevated Vbl_sel concurrently with the lower, first program level to provide an even lower gate-to-drain voltage.

Figure 13D:
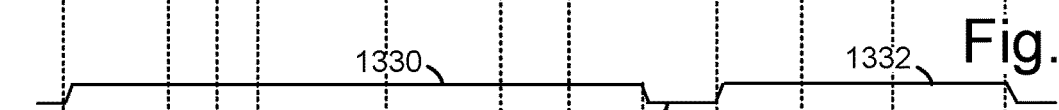
FIG. 13D depicts a voltage, Vbl_unsel, applied to bit lines of unselected NAND strings, consistent with FIG. 13A.

FIG. 13D depicts a voltage, Vbl_unsel, applied to bit lines of unselected NAND strings, consistent with FIG. 13A. These are unselected NAND strings in a selected sub-block which will be inhibited from programming. A plot 1330 represents 2 V in the pre-charge and program phases, a plot 1331 represents 0 V in the recovery phase and a plot 1332 represents 2 V in the verify phase.

Figure 13E:
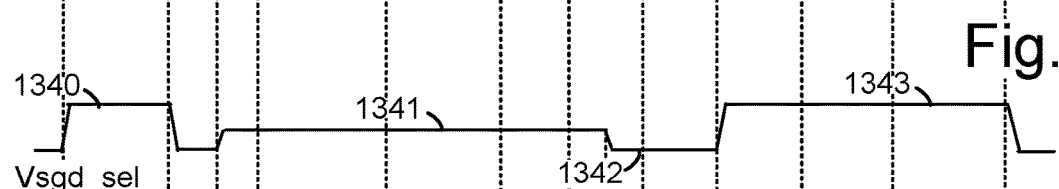
FIG. 13E depicts a voltage, Vsgd_sel, applied to SGD transistors of a selected sub-block, consistent with FIG. 13A.

FIG. 13E depicts a voltage, Vsgd_sel, applied to SGD transistors of a selected sub-block, consistent with FIG. 13A. A plot 1340 represents 8 V, a plot 1341 represents 2.5 V, a plot 1342 represents 0 V and a plot 1343 represents 8 V.

Figure 13F:
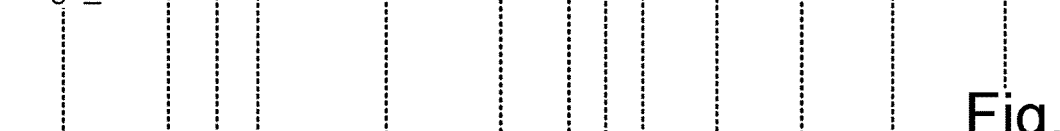
FIG. 13F depicts voltages applied to SGD transistors of unselected sub-blocks and to SGS transistors, consistent with FIG. 13A.

FIG. 13F depicts voltages applied to SGD transistors of unselected sub-blocks and to SGS transistors, consistent with FIG. 13A. A plot 1350 represents 8 V and a plot 1354 represents 0 V for Vsgs and Vsgd_unsel, respectively. A plot 1351 represents 0 V for both Vsgs and Vsgd_unsel. A plot 1352 represents 8 V for Vsgs and a plot 1353 represents 0 V for Vsgd_unsel.

Figure 13G:
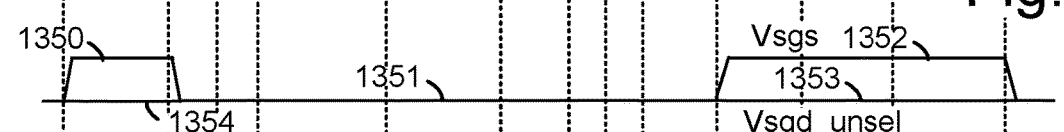
FIG. 13G depicts a voltage applied to a source line, consistent with FIG. 13A.

FIG. 13G depicts a voltage applied to a source line, consistent with FIG. 13A. A plot 1360 represents a pre-charge voltage such as 1 V, a plot 1361 represents 0 V and a plot 1362 represents 1 V.

In the pre-charge phase, a positive inhibit voltage (plot 1330) is provided to the drain-side channels of the unselected NAND strings to remove residue electrons and to provide a small amount of boosting such as 1-2 V. The SGD transistors of the selected and unselected sub-blocks are in a conductive state at this time, with a voltage of 8 V, for example. This allows the bit line voltage to be passed to the drain end channel. It is also possible for the SGS transistors of the selected and unselected sub-blocks to be in a conductive state at this time, with a voltage of 8 V, for example to allow Vsl to be passed to the source end of the channel. The plot 1331 represents Vbl_unsel returning to 0 V in part of the recovery phase, and the plot 1332 represents Vbl_unsel at 2 V during the verify phase, for example.

In the program phase, VWLn and Vwl_unsel are ramped up to Vpass, e.g., starting at t2, to provide a capacitive coupling up of the channels of the unselected NAND strings. VWLn is then ramped up further at t3 to the one or more program levels and held at Vpgm_L2 until t4. After the application of the program pulse, the word line voltages are ramped down in the recovery phase. Subsequently, in the verify phase, a verify test is performed by applying VvP on WLn and sensing the conductive state of the memory cells in the programmed NAND strings of the selected sub-block. Before the verify tests, VWLn is ramped up with VWL_unsel to Vread to equalize the channel potential.

During the program pulse, Vsgd_sel is high enough to provide the selected SGD transistors in a conductive state (a turn on state) for the programmed NAND strings, which receive Vbl_sel=0 V, but low enough to provide the selected SGD transistors in a non-conductive state for the unselected NAND strings, which receive Vbl_unsel=2 V.

During the verify phase, the SGD and SGS transistors are in a strongly conductive state to allow sensing to occur for the selected memory cells.

In FIGS. 14A and 14B, the vertical dimension denotes voltage and the horizontal dimension denotes time, with time points t0-t12. The period of time depicted corresponds to one program loop or program-verify iteration and includes the pre-charge phase 1311 (t0-t2), a program phase 1312a (t2-t4), the recovery phase 1313 (t4-t9) and the verify phase 1314 (t9-t12). The voltages depicted are examples. The pre-charge phase, recovery phase and verify phase correspond to those in FIG. 13A-13G. The program phase differs in that it has three program levels instead of two.

FIG. 14A depicts voltages applied to a selected word line, WLn in a program loop of a program operation in a single bit per cell mode, consistent with FIG. 12, steps 1201a and 1201b, where the program pulse has three program levels, Vpgm_L1-Vpgm_L3. Generally, a multi-step program pulse can have two or more program levels. This example provides three program levels, Vpgm_L1, Vpgm_L2 and Vpgm_L3, as represented by the plots 1403a, 1403b and 1403c, respectively, at the time periods of t3-t3a, t3a-t3b and t3b-t4, respectively. The three program levels can provide a more gradual programming which further reduces damage to the memory cells. The duration of the program pulse with three program levels can be the same as, or longer than, the duration of the program pulse with two program levels.

FIG. 14B depicts a voltage, VWL_unsel, applied to unselected word lines, consistent with FIG. 14A. The pre-charge phase, recovery phase and verify phase are the same as discussed in connection with FIG. 13A-13G. In the program phase, the plots 1411a, 1411b and 1411c represent a multi-level pass voltage and depict three pass voltages, Vpass_L1, Vpass_L2 and Vpass_L3, respectively, which are provided at the time periods of t3-t3a, t3a-t3b and t3b-t4, concurrent with the program levels of Vpgm_L1, Vpgm_L2 and Vpgm_L3, respectively. Additionally, the two step ups in the pass voltages, at t3a and t3b, are concurrent with the two step ups in the program voltage. The multi-level pass voltages can be provided on the adjacent word lines of the selected word line, in one approach, while the remaining word line receives a single level pass voltage, Vpass_L3. The step up on the pass voltage helps the step up of the selected word line voltage, as mentioned.

The voltages signals for Vbl_sel, Vbl_unsel, Vsgd_sel, Vsgd_unsel/Vsgs and Vsl can correspond to those depicted in FIG. 13C-13G.

In FIG. 15A-15G, the vertical dimension denotes voltage and the horizontal dimension denotes time, with time points t0-t14. The period of time depicted corresponds to one program loop or program-verify iteration and includes a pre-charge phase 1591 (t0-t2), a program phase 1592 (t2-t4), a recovery phase 1593 (t4-t9) and a verify phase 1594 (t9-t14). The voltages depicted are examples. The voltage signals for VWLn and VWL_unsel differ from those in FIG. 13A-14B in that there is a single program voltage level, and a single pass voltage level. Additionally, there are multiple verify tests in the verify phase, e.g., for the A, B and C states in this example.

FIG. 15A depicts voltages applied to a selected word line, WLn in a program loop of a program operation in a multiple bits per cell mode, consistent with FIG. 12, step 1212*b*, where the program pulse has a single program level, Vpgm.

In the pre-charge phase, a plot 1501 represents a turn on voltage for the memory cells such as 6 V.

In the program phase, a plot 1502 represents Vpass and a plot 1503 represents a single program level of Vpgm. In an initial program-verify loop of the one or more program-verify loops for MLC programming, Vpgm is a peak level of the single level program pulse of plot 1503, and this peak level is less than the second program level Vpgm_L2 of plot 1303*d* of the multi-level program pulse for the initial program-verify loop of SLC programming in FIG. 13A. As a result, it is appropriate to use the damage reduction countermeasure in the form of a multi-level program pulse for the initial program-verify loop of SLC programming but not for the initial program-verify loop of MLC programming. Programming time can improved be by omitting the multi-level program pulse since the time to transition between the multiple levels is avoided and the use of a reduced program level is avoided.

In the recovery phase, a plot 1504 represents a positive recovery voltage of Vcc=3 V. In the verify phase, a plot 1505 represents a voltage pulse at Vread. The voltage is then reduced to, e.g., 0 V at plot 1506 and increased to VvA, VvB and VvC at plots 1508, 1509 and 1510, respectively. The memory cells assigned to these data states are sensed during the corresponding verify voltage.

FIG. 15B depicts a voltage, VWL_unsel, applied to unselected word lines, consistent with FIG. 15A. A plot 1514 represents a turn on voltage such as 6 V, a plot 1511 represents a single level pass voltage, Vpass, a plot 1512 represents Vpass2Vread and a plot 1513 represents Vread. In this example, there is no step in the pass voltage and no step up in the program voltage between different program levels.

FIG. 15C depicts a voltage, Vbl_sel, applied to bit lines of programmed NAND strings, consistent with FIG. 15A. A plot 1520 represents a pre-charge voltage of, e.g., 1 V, a plot 1521 represents 0.5 V, and a plot 1522 represents Vsense=0.8 V.

FIG. 15D depicts a voltage, Vbl_unsel, applied to bit lines of unselected NAND strings, consistent with FIG. 15A. A plot 1530 represents 2 V in the pre-charge and program phases, a plot 1531 represents 0 V in the recovery phase and a plot 1532 represents 2 V in the verify phase.

FIG. 15E depicts a voltage, Vsgd_sel, applied to SGD transistors of a selected sub-block, consistent with FIG. 15A. A plot 1540 represents 8 V, a plot 1541 represents 2.5 V, a plot 1542 represents 0 V and a plot 1543 represents 8 V.

FIG. 15F depicts voltages applied to SGD transistors of unselected sub-blocks and to SGS transistors, consistent with FIG. 15A. A plot 1550 represents 8 V and a plot 1554 represents 0 V for Vsgs and Vsgd_unsel, respectively. A plot 1551 represents 0 V for both Vsgs and Vsgd_unsel. A plot 1552 represents 8 V for Vsgs and a plot 1553 represents 0 V for Vsgd_unsel.

FIG. 15G depicts a voltage applied to a source line, consistent with FIG. 15A. A plot 1560 represents a pre-charge voltage such as 1 V, a plot 1561 represents 0 V and a plot 1562 represents 1 V.

As mentioned at the outset, the program voltage level can be adjusted based on factors such as temperature, number of P-E cycles, selected sub-block position and word line position. Examples of adjustments are provided in FIG. 16A-17D. In FIG. 16A-16D, the adjustment is to the lower first program level, Vpgm_L1, and in FIG. 17A-17D, the adjustment is to both the lower first program level and the higher second program level, Vpgm_L2.

FIG. 16A depicts a plot of program voltage versus temperature in a single bit per cell program operation, consistent with FIG. 13A, plots 1303*a* and 1303*d*, where the first program level is adjusted to Vpgm_L1a or Vpgm_L1b as a function of temperature (Temp.) Generally, a lower temperature is associated with a larger increase in Vth of a memory cell when a program pulse of a given magnitude is applied. Accordingly, damage to the memory cell can be reduced by reducing the magnitude of the first program voltage, while still achieving a desired amount of programming in terms of a Vth increase when the temperature is relatively low. In this example, the temperature, as provided by the temperature-sensing circuit 116 of FIG. 1A, is classified into a lower range when it is below a threshold Temp_th and above a minimum operational level, Min., and into an upper range when it is at or above Temp_th and below a maximum operational level, Max.

When the temperature is in the lower range, a lower first program level, Vpgm_L1a is used. When the temperature is in the upper range, a higher first program level, Vpgm_L1b>Vpgm_L1a is used. The lower first program level is therefore an increasing function of the temperature. In this example, the same second program voltage, Vpgm_L2 is used for both the lower and upper ranges of the temperature.

FIG. 16B depicts a plot of program voltage versus a number of program-erase (P-E) cycles in a single bit per cell program operation, consistent with FIG. 13A, plots 1303*a* and 1303*d*, where the first program level is adjusted to Vpgm_L1a or Vpgm_L1b as a function of the number of P-E cycles. The number of P-E cycles can be kept separately for the SLC and MLC modes, in one approach. In this example, the number of P-E cycles is for the SLC mode since the program voltage is adjusted for the SLC mode.

Generally, a higher number of P-E cycles is associated with a larger increase in Vth of a memory cell when a program pulse of a given magnitude is applied. Accordingly, damage to the memory cell can be reduced by reducing the magnitude of the first program voltage, while still achieving a desired amount of programming in terms of a Vth increase when the number of P-E cycles is relatively high. In this example, the number of P-E cycles, as provided by the P-E cycle tracking circuit 117 of FIG. 1A is classified into a lower range when it is below a threshold number, P-E_th and above zero cycles, and into an upper range when it is at or above P-E_th.

When the number of P-E cycles is in the lower range, a lower first program level, Vpgm_L1a is used. When the number of P-E cycles is in the upper range, a higher first program level, Vpgm_L1b. The lower first program level is therefore an increasing function of the number of P-E cycles. In this example, the same second program voltage, Vpgm_L2 is used for both the lower and upper ranges of the number of P-E cycles.

FIG. 16C depicts a plot of program voltage versus a sub-block (SB) position in a single bit per cell program operation, consistent with FIG. 7C and FIG. 13A, plots 1303a and 1303d, where the first program level is adjusted to Vpgm_L1a or Vpgm_L1b as a function of the selected sub-block position in a block. As mentioned in connection with FIG. 7C, the thickness of the blocking oxide layer 663 can vary based on the sub-block position. The thickness is typically less for sub-blocks at the edge of a block, e.g., SB0 and SB3 than for interior sub-blocks, e.g., SB1 and SB2.

Additionally, a smaller thickness is associated with a larger gate-to-channel electric field and a corresponding larger increase in Vth of a memory cell when a program pulse of a given magnitude is applied. Accordingly, damage to the memory cell can be reduced by reducing the magnitude of the first program level, while still achieving a desired amount of programming in terms of a Vth increase when the sub-block being programmed has a relatively small thickness of the blocking oxide layer. In this example, a lower first program level, Vpgm_L1a is used for SB0 and SB3 because of the relatively small thickness of the blocking oxide layer, and a higher first program level, Vpgm_L1b is used for SB1 and SB2 because of the relatively larger thickness of the blocking oxide layer. Note that the blocking oxide layer thickness can vary for other reasons than the sub-block position. Accordingly, generally, the first program level can be set as an increasing function of thickness of the blocking oxide layer for a sub-block.

In this example, the same second program voltage, Vpgm_L2 is used for the different sub-blocks.

FIG. 16D depicts a plot of program voltage versus a selected word line position in a single bit per cell program operation, consistent with FIG. 13A, plots 1303a and 1303d, where the first program level is adjusted to Vpgm_L1a or Vpgm_L1b as a function of the selected word line position in a block. As mentioned in connection with FIGS. 6C and 6D, the width of the memory hole can vary based on the position of the selected word line among the plurality of word lines of a block, e.g., and the height of the selected word line above the substrate.

Additionally, a smaller width is associated with a larger gate-to-channel electric field and a corresponding larger increase in Vth of a memory cell when a program pulse of a given magnitude is applied. Accordingly, damage to the memory cell can be reduced by reducing the magnitude of the first program level, while still achieving a desired amount of programming in terms of a Vth increase when the corresponding memory hole width of a selected word line is relatively small. This example is consistent with FIG. 6C, where the memory hole width generally increases with an increasing height above the substrate.

In this example, the WL position is classified into a lower range when it is below a threshold word line, WL_th, and into an upper range when it is at or above WL_th. The lower range of word lines can include the bottommost word line, WL0, alone, or in a bottommost group of word lines which is adjacent to the substrate. For example, the group can include up to 10-20% of the word lines.

When the selected word line is in the lower range, a lower first program level, Vpgm_L1a is used. When the selected word line is in the upper range, a higher first program level, Vpgm_L1b is used. The lower first program level is therefore an increasing function of the height of the selected word line above the substrate. In this example, the same second program voltage, Vpgm_L2 is used for both the lower and upper ranges of the number of P-E cycles.

The examples of FIG. 17A-17D are similar to the examples of FIG. 16A-16D, respectively, except the higher program level Vpgm_L2 is adjusted in addition to the lower program level Vpgm_L1. The difference between Vpgm_L1a and Vpgm_L2a can be the same or different than the difference between Vpgm_L1b and Vpgm_L2b.

Figure 17A:
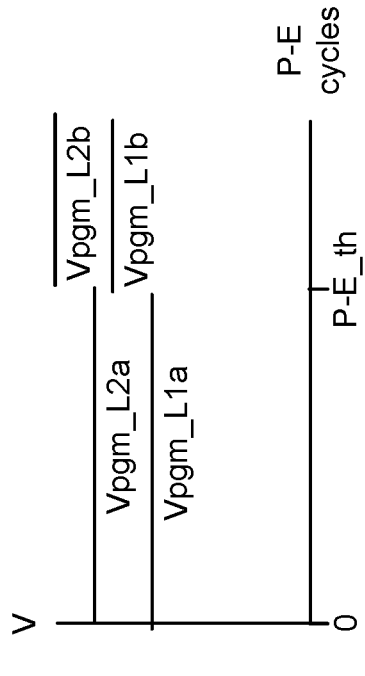
FIG. 17A depicts a plot of program voltage versus temperature in a single bit per cell program operation, consistent with FIG. 13A, plots 1303a and 1303d, where the first program level is adjusted to Vpgm_L1a or Vpgm_L1b and the second program level is adjusted to Vpgm_L2a or Vpgm_L2b as a function of temperature.

FIG. 17A depicts a plot of program voltage versus temperature in a single bit per cell program operation, consistent with FIG. 13A, plots 1303a and 1303d, where the first program level is adjusted to Vpgm_L1a or Vpgm_L1b and the second program level is adjusted to Vpgm_L2a or Vpgm_L2b as a function of temperature.

When the temperature is in the lower range, a lower first program level, Vpgm_L1a and a lower second program level, Vpgm_L2a, are used. When the temperature is in the upper range, a higher first program level, Vpgm_L1b, and a higher second program level, Vpgm_L2b, are used. The lower and higher first and second program levels are therefore an increasing function of the temperature.

Figure 17B:
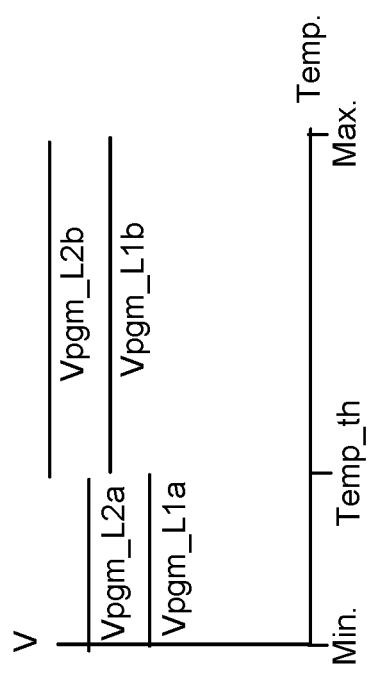
FIG. 17B depicts a plot of program voltage versus a number of program-erase (P-E) cycles in a single bit per cell program operation, consistent with FIG. 13A, plots 1303a and 1303d, where the first program level is adjusted to Vpgm_L1a or Vpgm_L1b and the second program level is adjusted to Vpgm_L2a or Vpgm_L2b as a function of the number of P-E cycles.

FIG. 17B depicts a plot of program voltage versus a number of program-erase (P-E) cycles in a single bit per cell program operation, consistent with FIG. 13A, plots 1303a and 1303d, where the first program level is adjusted to Vpgm_L1a or Vpgm_L1b and the second program level is adjusted to Vpgm_L2a or Vpgm_L2b as a function of the number of P-E cycles.

When the number of P-E cycles is in the lower range, a lower first program level, Vpgm_L1a and a lower second program level, Vpgm_L2a, are used. When the number of P-E cycles is in the upper range, a higher first program level, Vpgm_L1b, and a higher second program level, Vpgm_L2b, are used. The lower and higher first and second program levels are therefore an increasing function of the number of P-E cycles.

Figure 17C:
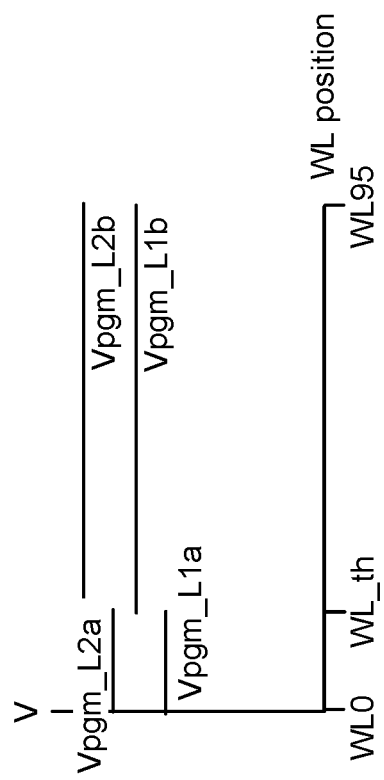
FIG. 17C depicts a plot of program voltage versus a sub-block (SB) position in a single bit per cell program operation, consistent with FIG. 7C and FIG. 13A, plots 1303a and 1303d, where the first program level is adjusted to Vpgm_L1a or Vpgm_L1b and the second program level is adjusted to Vpgm_L2a or Vpgm_L2b as a function of the selected sub-block position in a block.

FIG. 17C depicts a plot of program voltage versus a sub-block (SB) position in a single bit per cell program operation, consistent with FIG. 7C and FIG. 13A, plots 1303a and 1303d, where the first program level is adjusted to Vpgm_L1a or Vpgm_L1b and the second program level is adjusted to Vpgm_L2a or Vpgm_L2b as a function of the selected sub-block position in a block.

In this example, a lower first program level, Vpgm_L1a, and a lower second program level, Vpgm_L2a, are used for SB0 and SB3 because of the relatively small thickness of the blocking oxide layer. A higher first program level, Vpgm_L1b, and a higher second program level, Vpgm_L2b, are used for SB1 and SB2 because of the relatively larger thickness of the blocking oxide layer. Generally, the first and second program levels can be set as an increasing function of thickness of the blocking oxide layer for a sub-block.

Figure 17D:
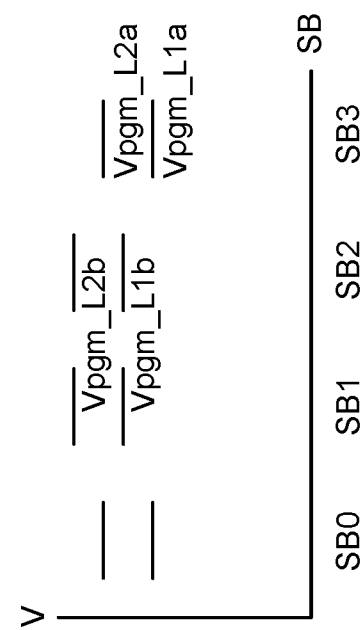
FIG. 17D depicts a plot of program voltage versus a selected word line position in a single bit per cell program operation, consistent with FIG. 13A, plots 1303a and 1303d, where the first program level is adjusted to Vpgm_L1a or Vpgm_L1b and the second program level is adjusted to Vpgm_L2a or Vpgm_L2b as a function of the selected word line position in a block.

FIG. 17D depicts a plot of program voltage versus a selected word line position in a single bit per cell program operation, consistent with FIG. 13A, plots 1303a and 1303d, where the first program level is adjusted to Vpgm_L1a or Vpgm_L1b and the second program level is adjusted to Vpgm_L2a or Vpgm_L2b as a function of the selected word line position in a block.

When the selected word line is in the lower range, a lower first program level, Vpgm_L1a, and a lower second program level, Vpgm_L2a, are used. When the selected word line is in the upper range, a higher first program level, Vpgm_L1b, and a higher second program level, Vpgm_L2b, are used. The lower and higher first and second program levels are therefore an increasing function of the height of the selected word line above the substrate.

Accordingly, it can be seen that in one implementation, an apparatus comprises: a control circuit configured to connect to a set of memory cells and program the set of memory cells, the set of memory cells comprise memory cells connected to a selected word line. The control circuit is configured to: initiate a program operation for the memory cells connected to the selected word line; determine whether a condition is met for the program operation to apply a multi-level program pulse to the memory cells connected to the selected word line, the multi-level program pulse comprises a first program level followed by a second program level which is greater than the first program level; when the condition is met, apply the multi-level program pulse to the memory cells connected to the selected word line; and when the condition is not met, apply a single level program pulse to the memory cells connected to the selected word line.

In another implementation, a method comprises: initiating a program operation for memory cells connected to a selected word line, the memory cells are in a block and the block is configured to alternate between storing data in a single bit per cell mode and a multiple bits per cell mode; when the memory cells are to be programmed in a single bit per cell mode in the program operation, performing a respective first program-verify iteration of the program operation, the performing the respective first program-verify iteration comprises ramping up a voltage of the selected word line from an initial level to a pass level, from the pass level to a first program level, and from the first program level to a second program level; and when the memory cells are to be programmed in a multiple bits per cell mode in the program operation, performing a respective first program-verify iteration of the program operation, the performing the respective first program-verify iteration comprises ramping up the voltage of the selected word line from the initial level to the pass level, and from the pass level directly to a peak level which is less than the first program level.

In another implementation, an apparatus comprises: a control circuit configured to connect to a set of memory cells, the set of memory cells comprise memory cells connected to a selected word line; and an interface connected to the control circuit. The control circuit is configured to issue a command via the interface to: perform an initial program-verify iteration of a program operation, wherein to perform the initial program-verify iteration, the control circuit is configured to bias the memory cells with a first control gate-to-drain voltage followed by a second control gate-to-drain voltage which is higher than the first control gate-to-drain voltage, followed by performing a verify test for the memory cells connected to the selected word line, the first control gate-to-drain voltage and the second control gate-to-drain voltage are configured to induce programming of the memory cells connected to the selected word line.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a set of memory cells and program the set of memory cells, the set of memory cells comprise memory cells connected to a selected word line, the control circuit is configured to:
initiate a program operation for the memory cells connected to the selected word line;
determine whether a condition is met for the program operation to apply a multi-level program pulse to the memory cells connected to the selected word line, the multi-level program pulse comprises a first program level followed by a second program level which is greater than the first program level;
when the condition is met, apply the multi-level program pulse to the memory cells connected to the selected word line; and
when the condition is not met, apply a single level program pulse to the memory cells connected to the selected word line.

2. The apparatus of claim 1, wherein:
when the condition is met, the control circuit is configured to apply a multi-level pass voltage to an unselected word line which is adjacent to the selected word line, the multi-level pass voltage steps up from a first pass level to a second pass level concurrently with a step up in the multi-level program pulse from the first program level to the second program level; and
when the condition is not met, the control circuit is configured to apply a single level pass voltage to the unselected word line which is adjacent to the selected word line.

3. The apparatus of claim 1, wherein:
the condition is met when the memory cells connected to the selected word line are programmed in a single bit per cell mode but not when the memory cells connected to the selected word line are programmed in a multiple bits per cell mode.

4. The apparatus of claim 3, wherein:
the set of memory cells alternate between storing data in the single bit per cell mode and storing data in the multiple bits per cell mode.

5. The apparatus of claim 1, wherein:
a peak level of the single level program pulse is less than the second program level of the multi-level program pulse.

6. The apparatus of claim 1, wherein:
the multi-level program pulse comprises a third program level after the second program level; and
the third program level is greater than the second program level.

7. The apparatus of claim 1, wherein:
the condition is met when the memory cells connected to the selected word line are programmed in an initial program-verify loop of the program operation but not when the memory cells connected to the selected word line are programmed in an additional program-verify loop of the program operation.

8. The apparatus of claim 1, wherein:
to apply the multi-level program pulse to the memory cells connected to the selected word line, the control circuit is configured to ramp up a voltage of the selected word line from an initial level to a pass voltage, from the pass voltage to the first program level, and from the first program level to the second program level; and to apply the single level program pulse to the memory cells connected to the selected word line, the control circuit is configured to ramp up a voltage of the selected word line from the initial level to the pass voltage, and from the pass voltage directly to a peak level.

9. The apparatus of claim 1, wherein:
the memory cells connected to the selected word line are arranged in NAND strings in sub-blocks of a block and are programmed one sub-block at a time in the program operation; and
the first program level is a function of a sub-block which is programmed in the program operation.

10. The apparatus of claim 1, wherein:
the first program level is a function of a height of the selected word line above a substrate.

11. The apparatus of claim 1, wherein:
the first program level is a function of a temperature.

12. The apparatus of claim 1, wherein:
the memory cells connected to the selected word line are arranged in NAND strings in a plurality of sub-blocks of a block and are programmed one sub-block at a time in the program operation;
the NAND strings comprise a blocking oxide; and
the first program level is a function of a thickness of the blocking oxide of a sub-block which is programmed in the program operation.

13. A method, comprising:
initiating a program operation for memory cells connected to a selected word line, the memory cells are in a block and the block is configured to alternate between storing data in a single bit per cell mode and a multiple bits per cell mode;
when the memory cells are to be programmed in a single bit per cell mode in the program operation, performing a respective first program-verify iteration of the program operation, the performing the respective first program-verify iteration comprises ramping up a voltage of the selected word line from an initial level to a pass level, from the pass level to a first program level, and from the first program level to a second program level; and
when the memory cells are to be programmed in a multiple bits per cell mode in the program operation, performing a respective first program-verify iteration of the program operation, the performing the respective first program-verify iteration comprises ramping up the voltage of the selected word line from the initial level to the pass level, and from the pass level directly to a peak level which is less than the first program level.

14. The method of claim 13, wherein:
when the memory cells are to be programmed in the single bit per cell mode, performing a respective additional program-verify iteration of the program operation, after the performing of the respective additional program-verify iteration, the performing the respective additional program-verify iteration comprises ramping up a voltage of the selected word line from an initial level to the pass level, and from the pass level directly to a peak program level.

15. The method of claim 13, wherein:
when the memory cells are to be programmed in the single bit per cell mode, ramping up a voltage of unselected word lines which are adjacent to the unselected word lines from a first pass level to a second pass level concurrent with the ramping up of the voltage of the selected word line from the first program level to the second program level.

16. An apparatus, comprising:
a control circuit configured to connect to a set of memory cells, the set of memory cells comprise memory cells connected to a selected word line; and
an interface connected to the control circuit, the control circuit is configured to issue a command via the interface to:
perform an initial program-verify iteration of a program operation, wherein to perform the initial program-verify iteration, the control circuit is configured to bias the memory cells with a first control gate-to-drain voltage followed by a second control gate-to-drain voltage which is higher than the first control gate-to-drain voltage, followed by performing a verify test for the memory cells connected to the selected word line, the first control gate-to-drain voltage and the second control gate-to-drain voltage are configured to induce programming of the memory cells connected to the selected word line.

17. The apparatus of claim 16, wherein:
to bias the memory cells with the first control gate-to-drain voltage followed by the second control gate-to-drain voltage, the control circuit is configured to apply a voltage at a first program level followed by a second program level, higher than the first program level, to the selected word line.

18. The apparatus of claim 16, wherein:
to bias the memory cells with the first control gate-to-drain voltage followed by the second control gate-to-drain voltage, the control circuit is configured to apply a first drain voltage followed by a second drain voltage, lower than the first drain voltage, to the memory cells connected to the selected word line.

19. The apparatus of claim 16, wherein:
to bias the memory cells with the first control gate-to-drain voltage followed by the second control gate-to-drain voltage, the control circuit is configured to apply a voltage at a fixed level to the selected word line while applying the first drain voltage followed by the second drain voltage.

20. The apparatus of claim 16, wherein the control circuit is configured to issue a command via the interface to:
perform an additional program-verify iteration of the program operation, wherein to perform the additional program-verify iteration, the control circuit is configured to bias the memory cells with a single control gate-to-drain voltage which is configured to induce programming of the memory cells connected to the selected word line, the single control gate-to-drain voltage is higher than the second control gate-to-drain voltage, followed by performing a verify test for the memory cells connected to the selected word line.

* * * * *